United States Patent
Fletcher et al.

(10) Patent No.: US 9,417,774 B2
(45) Date of Patent: *Aug. 16, 2016

(54) PROACTIVE MONITORING TREE WITH NODE PINNING FOR CONCURRENT NODE COMPARISONS

(71) Applicant: Splunk Inc., San Francisco, CA (US)

(72) Inventors: Tristan Fletcher, Pacifica, CA (US); Cary Glen Noel, Pleasant Hill, CA (US); Alok Bhide, Mountain View, CA (US)

(73) Assignee: SPLUNK INC., San Francisco, CA (US)

(*) Notice: Subject to any disclaimer, the term of this patent is extended or adjusted under 35 U.S.C. 154(b) by 23 days.

This patent is subject to a terminal disclaimer.

(21) Appl. No.: 14/609,080

(22) Filed: Jan. 29, 2015

(65) Prior Publication Data

US 2015/0149914 A1    May 28, 2015

Related U.S. Application Data

(63) Continuation of application No. 14/253,697, filed on Apr. 15, 2014, now Pat. No. 9,015,716, which is a continuation-in-part of application No. 14/167,316, filed on Jan. 29, 2014, and a continuation-in-part of application No. 13/874,423, filed on Apr. 30, 2013, now Pat. No. 8,904,389, and a continuation-in-part of application No. 13/874,434, filed on Apr. 30, 2013, now Pat. No. 8,683,467, and a continuation-in-part of application No. 13/874,441, filed on Apr. 30, 2013, now Pat. No. 9,164,786, and a continuation-in-part of application No. 13/874,448, filed on Apr. 30, 2013.

(60) Provisional application No. 61/883,869, filed on Sep. 27, 2013, provisional application No. 61/900,700, filed on Nov. 6, 2013, provisional application No. 61/979,484, filed on Apr. 14, 2014.

(51) Int. Cl.
| | |
|---|---|
| G06F 9/46 | (2006.01) |
| G06F 3/0484 | (2013.01) |
| H01L 41/22 | (2013.01) |
| G06F 9/455 | (2006.01) |
| G06F 11/32 | (2006.01) |
| G06F 3/0482 | (2013.01) |
| G06F 11/34 | (2006.01) |

(52) U.S. Cl.
CPC .......... *G06F 3/04842* (2013.01); *G06F 3/0482* (2013.01); *G06F 9/45533* (2013.01); *G06F 11/323* (2013.01); *H01L 41/22* (2013.01); *G06F 11/3409* (2013.01); *G06F 2201/815* (2013.01)

(58) Field of Classification Search
None
See application file for complete search history.

(56) References Cited

U.S. PATENT DOCUMENTS 8,738,333 B1 * 5/2014 Behera .................. G06F 9/5061
 703/2
2009/0049372 A1  2/2009 Goldberg
(Continued)

*Primary Examiner* — Meng An
*Assistant Examiner* — James J Lee
(74) *Attorney, Agent, or Firm* — Park, Vaughan, Fleming & Dowler LLP

(57) ABSTRACT

In some embodiments, in response to the user selecting a first node in the tree to be pinned, the system displays a first detail panel for the first node, wherein the first detail panel displays state information for the first node, wherein the state information is frozen at the time of pinning. Moreover, in response to the user selecting a second node in the tree to be pinned, the system displays a second detail panel for the second node, wherein the second detail panel displays state information for the second node, wherein the state information is frozen at the time of pinning. Note that the first detail panel is displayed concurrently with the second detail panel to facilitate comparing state information between the first and second nodes.

20 Claims, 18 Drawing Sheets

(56) References Cited

U.S. PATENT DOCUMENTS

| | | |
|---|---|---|
| 2012/0023429 A1 | 1/2012 | Medhi |
| 2012/0036484 A1 | 2/2012 | Zhang et al. |
| 2012/0311475 A1 | 12/2012 | Wong |
| 2014/0059488 A1 | 2/2014 | El-Jayousi et al. |
| 2014/0201642 A1 | 7/2014 | Vicat-Blanc |
| 2014/0280894 A1 | 9/2014 | Reynolds et al. |

* cited by examiner

```
Original search: 1301
search "error" | stats count BY host

Sent to peers: 1302
search "error" | prestats count BY host

Executed by search head: 1303
Merge the prestats results received from peers (reduce)
```

FIG. 13

PROACTIVE MONITORING TREE WITH NODE PINNING FOR CONCURRENT NODE COMPARISONS

RELATED APPLICATIONS

This application is a continuation of, and hereby claims priority under 35 U.S.C. §120 to, pending U.S. patent application Ser. No. 14/253,697 filed on 15 Apr. 2014, which is itself a continuation-in-part of: pending U.S. patent application Ser. No. 14/167,316 filed on 29 Jan. 2014; pending U.S. patent application Ser. No. 13/874,423 filed 30 Apr. 2013; pending U.S. patent application Ser. No. 13/874,434 filed 30 Apr. 2013; pending U.S. patent application Ser. No. 13/874,441 filed 30 Apr. 2013; and pending U.S. patent application Ser. No. 13/874,448 filed 30 Apr. 2013. This application further claims benefit under 35 U.S.C. §119 to U.S. Provisional Application No. 61/883,869 filed 27 Sep. 2013, U.S. Provisional Application No. 61/900,700 filed 6 Nov. 2013, and U.S. Provisional Application No. 61/979,484 filed 14 Apr. 2014. The above-listed applications are hereby incorporated by reference herein.

This application is also related to U.S. patent application Ser. No. not yet assigned, filed Apr. 15, 2014, entitled "Proactive Monitoring Tree with Severity State Sorting" by inventors Tristan Fletcher and Cary Noel; U.S. patent application Ser. No. not yet assigned, filed Apr. 15, 2014, entitled "Proactive Monitoring Tree with State Distribution Ring" by inventors Tristan Fletcher and Cary Noel; and U.S. patent application Ser. No. not yet assigned, filed Apr. 15, 2014, entitled "Proactive Monitoring Tree Providing Distribution Stream Chart with Branch Overlay" by inventors Tristan Fletcher and Cary Noel.

RELATED ART

The disclosed embodiments generally relate to techniques for monitoring and analyzing performance in a computer system. More specifically, the disclosed embodiments relate to the design of a performance-monitoring system that provides a user interface with a proactive monitoring tree that facilitates visualizing performance information for virtual machines and associated host systems in a hierarchically structured computing environment.

BACKGROUND

Organizations are increasingly relying on cloud-based computing systems to perform large-scale computational tasks. Such cloud-based computing systems are typically operated by hosting companies that maintain a sizable computational infrastructure, often comprising thousands of servers sited in geographically distributed data centers. Customers typically buy or lease computational resources from these hosting companies. The hosting companies in turn provision computational resources according to the customer's requirements and then enable the customers to access these resources.

In many cases, cloud-based computing systems provide a virtualized computing environment, wherein tasks run on "virtual machines" that execute on underlying physical host systems. Such virtualized computing environments enable computational tasks to be easily moved among host systems to facilitate load balancing and fault tolerance. However, they also complicate the process of diagnosing and resolving performance problems because bottlenecks can arise at both the virtual-machine level and the host-system level.

Existing performance-monitoring tools do not provide an easy way to diagnose performance problems in such computing systems.

BRIEF DESCRIPTION OF THE FIGURES

The patent or application file contains at least one drawing executed in color. Copies of this patent or patent application publication with color drawing(s) will be provided by the Office upon request and payment of the necessary fee.

FIG. 13 illustrates an example of a search query received from a client that the search head can split into two parts in accordance with the disclosed embodiments.

DETAILED DESCRIPTION

Overview

The disclosed embodiments relate to a performance-monitoring system that provides a user interface that displays a proactive monitoring tree in accordance with the disclosed embodiments. This proactive monitoring tree enables a user to easily view and understand relationships among various factors that affect performance of a hierarchically structured computing system. More specifically, a user can navigate the proactive monitoring tree to gain a better understanding of the performance of an associated computing system by examining values for a selected performance metric across a set of entities (e.g., virtual machines and host systems) that comprise the computing system, wherein the entities are represented as nodes in the proactive monitoring tree. Values for the selected metric can be aggregated for each of the entities over a selected time range and then compared against a set of thresholds to determine performance states for the entities. These performance states can be represented by using different colors to display associated nodes of the proactive monitoring tree. For example, performance states in a virtual machine environment can indicate whether the performance for a specific entity (virtual machine or host system) is in a critical state (red), a warning state (orange), a normal state (green), or an unknown/offline state (gray).

The proactive monitoring tree enables a user to easily navigate the hierarchy by selectively expanding nodes representing sets of entities (e.g., computing clusters) to view performance information for lower-level nodes associated with lower-level entities (e.g., virtual machines or host systems.) This ease of navigation enables a user to quickly diagnose the root cause of a performance problem.

Figure 1:
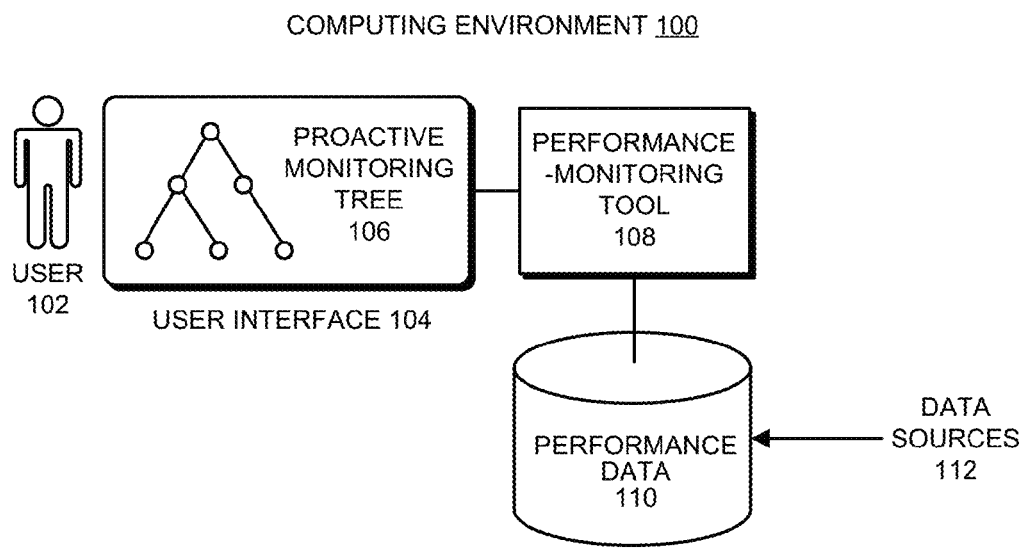
FIG. 1 illustrates a performance-monitoring tool that displays a proactive monitoring tree in accordance with the disclosed embodiments.

An exemplary performance-monitoring system that provides a proactive monitoring tree system is illustrated in FIG. 1. This system includes a performance-monitoring tool 108 comprising a software application that enables a user to monitor and analyze a set of performance data 110.

This performance data 110 can originate from various data sources 112. In general, performance data 110 can comprise any type of data associated with entities that can be hierarchically organized with a one-to-many relationship between entities. For example, performance data 110 can originate from a virtual machine system and can specify utilization rates for various resources, such as central-processing unit (CPU) capacity, memory capacity and communication bandwidth for individual virtual machines or underlying host systems that comprise the virtual machine system. In another example, performance data 110 can originate from a database containing economic data. In this example, the data can relate to economic indicators such as per capita GDP, unemployment rates, and income distribution for the different states, counties and cities. In another example, performance data 110 can originate from a database containing census data. In this example, the data can relate to racial, religious and ethnic compositions of various states, counties and cities. In yet another example, performance data 110 can originate from a database containing information on communicable diseases. In this example, the data can relate to the number of cases of specific diseases and associated rates of mortality for different countries, states and cities. In another example, performance data 110 can originate from a database containing financial information for a corporation. In this example, the data can relate to financial performance for various subsidiaries, divisions and departments within the corporation.

Performance data 110 can also be collected using time windows that vary in size. For example, the data sources 112 can provide data values collected over time windows that range in size from microseconds, to seconds, to years.

Moreover, performance data 110 can comprise real-time data that is collected periodically (e.g., every three minutes) from an active system. Alternatively, performance data 110 can comprise non-real-time data, such as census data, that is collected every ten years.

Performance data 110 can also include values for many different types of performance metrics. For example, the performance metrics for a virtual machine system can include: (1) CPU-related performance metrics, such as utilization per host, virtual machine, resource pool or compute resource; (2) disk-related performance metrics, such as disk utilization per host, virtual machine, or datastore, wherein the disk metrics can include I/O performance (such as latency and read/write speeds), and utilization metrics for storage as a finite resource; (3) memory-related performance metrics, such as memory utilization per host, virtual machine, resource pool, or compute resource; (4) network-related performance metrics, such as network utilization for both physical and virtual network interface controllers (NICs) and other network devices, such as virtual switches that support connectivity among system components, such as hosts, virtual machines and virtual machine kernels; (5) energy-usage statistics, such as energy usage per host; (6) data traffic-related performance metrics, such as storage path data traffic statistics and storage adapter data traffic statistics; (7) overall system availability performance metrics, such as uptime and system heartbeat statistics; (8) cluster-related performance metrics, such as cluster utilization; and (9) virtual machine performance statistics, such as statistics related to virtual machine power and provisional operations. For more details on possible performance metrics, please see U.S. patent Ser. No. 14/167,316 filed 29 Jan. 2014 that provides a list of such performance metrics and is hereby incorporated by reference herein. Also, see "vSphere Monitoring and Performance" Update 1, vSphere 5.5, EN-001357-00, http://pubs.vmware.com/vsphere-55/topic/com.vmware.ICbase/PDF/vsphere-esxi-vcenter-server-551-monitoring-performance-guide.pdf.

During operation, performance-monitoring tool 108 displays a user interface 104 to a user 102. User interface 104 displays a proactive monitoring tree 106 comprising nodes associated with specific entities, such as a virtual machine or a host system, or a set of entities, such as a cluster of host systems or multiple clusters. These nodes provide a visual indicator (e.g., a color) to indicate performance states (associated with a specific performance metric) for each entity. For example, a red-colored node may indicate that a value of a performance metric for the node is in a critical range. Note that a user 102 is able to navigate the nodes of proactive monitoring tree 106 by selectively expanding lower-level nodes to view performance information for entities represented by the nodes. This enables the user to determine the root cause of a performance problem by quickly identifying an entity (e.g., virtual machine) that is causing a performance bottleneck for the system.

Proactive Monitoring Tree

Figure 2A:
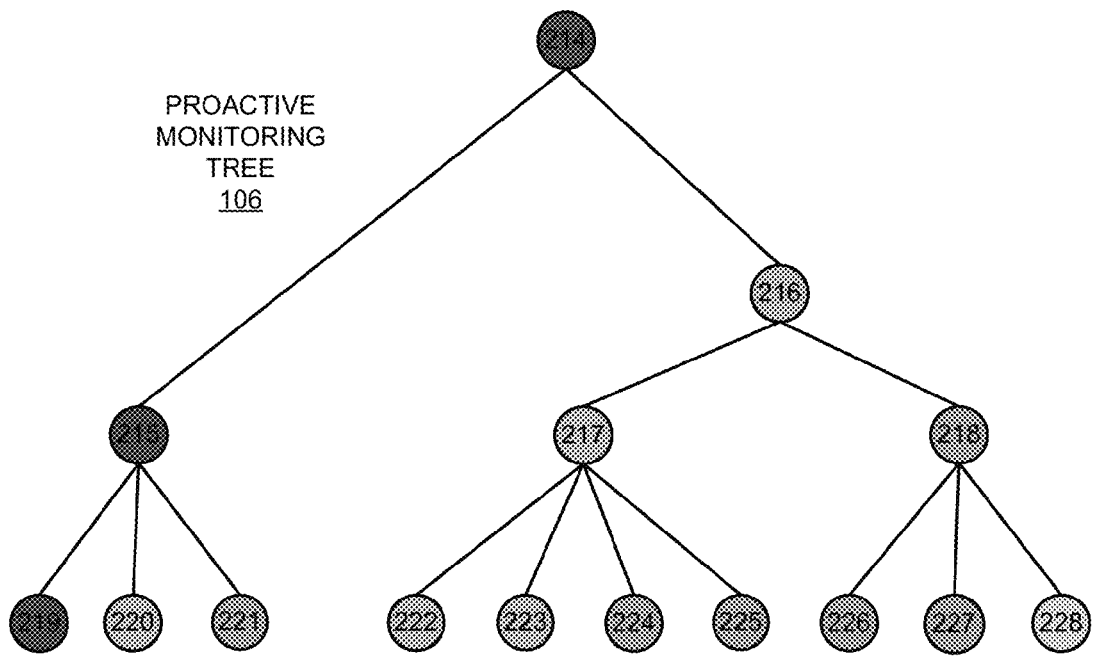
FIG. 2A illustrates an exemplary proactive monitoring tree in accordance with the disclosed embodiments.

FIG. 2A illustrates an exemplary proactive monitoring tree 106 in accordance with the disclosed embodiments. A proactive monitoring tree 106 can generally be used to represent data values for any entities that have one-to-many relationships (e.g., parent-child relationships) and are hierarchically structured to form one or more trees. For example, in a computing system that supports execution of virtual machines, each node in the proactive monitoring tree 106 can represent: (1) a virtual machine; (2) a host system that executes one or more virtual machines; (3) a cluster comprising one or more host systems; or (4) a virtual center comprising one or more clusters. Hence, in FIG. 2A nodes 222-228 can represent virtual machines, nodes 217-221 can represent host systems that execute virtual machines, nodes 215-216 can represent computing clusters comprising multiple host systems, and node 214 can represent a virtual center comprising multiple clusters.

Each node in proactive monitoring tree 106 can be colored to indicate a performance state for the associated entity. For example, if the performance metric is memory utilization, a node for a virtual machine can be colored: red to indicate that memory utilization for the virtual machine is in a critical range (e.g., over 99%); orange to indicate a warning range (e.g., 90% to 99%); green to indicate a normal range (e.g., 0% to 90%); and gray to indicate that memory utilization is unknown for the virtual machine. Note that performance states, and the associated ranges of values for the performance states, can be fixed or may be configurable by a user.

Performance states can alternatively be indicated in different ways (instead of by using colors), such as by using different patterns (e.g., cross-hatching or dots), through different levels of gray-shading, or through textual labels that explicitly announce the performance state.

Moreover, the performance state for a parent node can depend on the performance states of the parent's children. For example, the performance state for a host node can depend on the worst-case performance state for any virtual machine that executes on the host node, the performance state for a cluster node can depend on the worst-case performance state for any host node in the cluster, and the performance state for a virtual center node can depend on the worst-case performance state for any cluster in the virtual center.

More specifically, referring to FIG. 2A, the performance state for node 215 is red because the worst-case performance state for child nodes 219-221 is red; the performance state for node 217 is orange because the worst-case performance state for child nodes 222-225 is orange; the performance state for node 218 is green because the worst-case performance state for child nodes 226-228 is green; the performance state for node 216 is orange because the worst-case performance state for child nodes 217-218 is orange; and finally, the performance state for node 214 is red because the worst-case performance state for child nodes 215-216 is red.

Note that assigning performance states to a parent node based on the worst-case states for associated child nodes enables a viewer to determine quickly which branches of the tree are likely to have performance problems. However, performance states can be assigned to parent nodes in alternative ways. For example, a performance state for a parent node can depend on the average performance state (or most-common performance state) of its child nodes.

Proactive monitoring tree 106 also supports navigational operations to facilitate analyzing performance problems. While displaying a large system comprising hundreds or thousands of entities, it may be impractical to display nodes for all of the entities at the same time. (Note that it may simply be impossible to fit hundreds or thousands of nodes on a single display screen.) Even if it is possible to display a large number of nodes in a single display screen, the large number of displayed nodes can obscure performance problems for a small subset of the nodes that have performance problems.

Figure 2B:
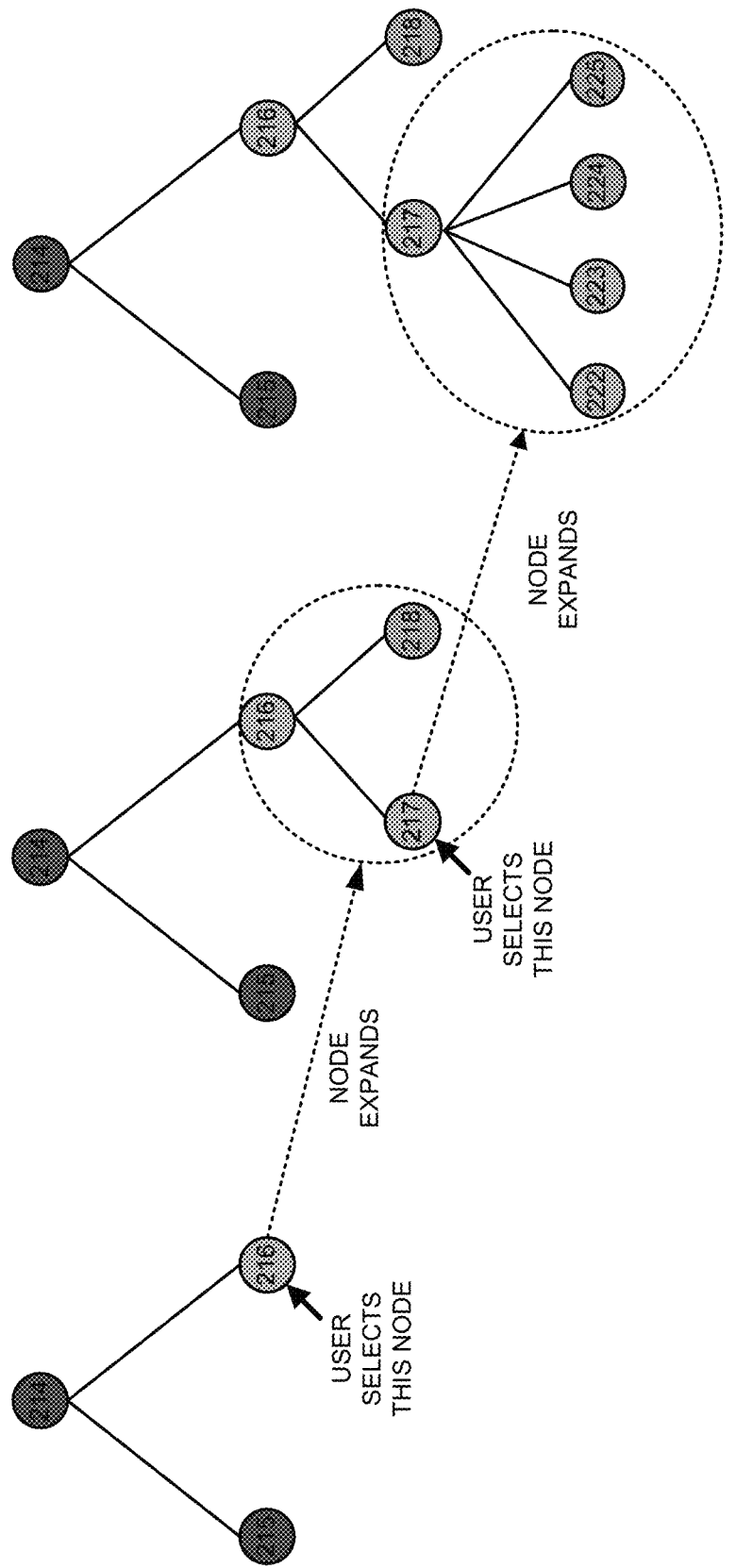
FIG. 2B illustrates how nodes in a proactive monitoring tree can be selectively expanded in accordance with the disclosed embodiments.

To facilitate viewing systems with a large number of nodes, proactive monitoring tree 106 enables the user to selectively expand parent nodes to display underlying child nodes. For example, FIG. 2B illustrates how nodes in the proactive monitoring tree can be selectively expanded by a user. On the left-hand side of FIG. 2B, the proactive monitoring tree is initially displayed with three nodes 214-216. At this point, lower-level nodes are hidden from the user. When the user selects (e.g., uses a mouse to click on) node 216, node 216 expands to reveal underlying child nodes 217-218. When the user selects node 217, node 217 expands to reveal underlying child nodes 222-225. Note that if an expanded tree does not completely fit on the screen, the user can grab and move the tree to change which portion of the expanded tree is displayed on the screen. These navigational operations enable a user to quickly "drill down" into a branch of interest to explore the performance states of nodes in the branch. (Note that an expanded node can be selected again to hide its underlying children.)

By presenting performance information in this top-down manner, the proactive monitoring tree enables a user to identify where a computing system is experiencing performance problems, and to determine how the computing system can be modified to alleviate these problems. Furthermore, by associating performance values with a set of performance states, a user can easily understand how different portions of the computing system are performing.

We next describe how such performance data can be collected in a server system that supports execution of virtual machines.

Exemplary Performance-Monitoring System

Figure 3:
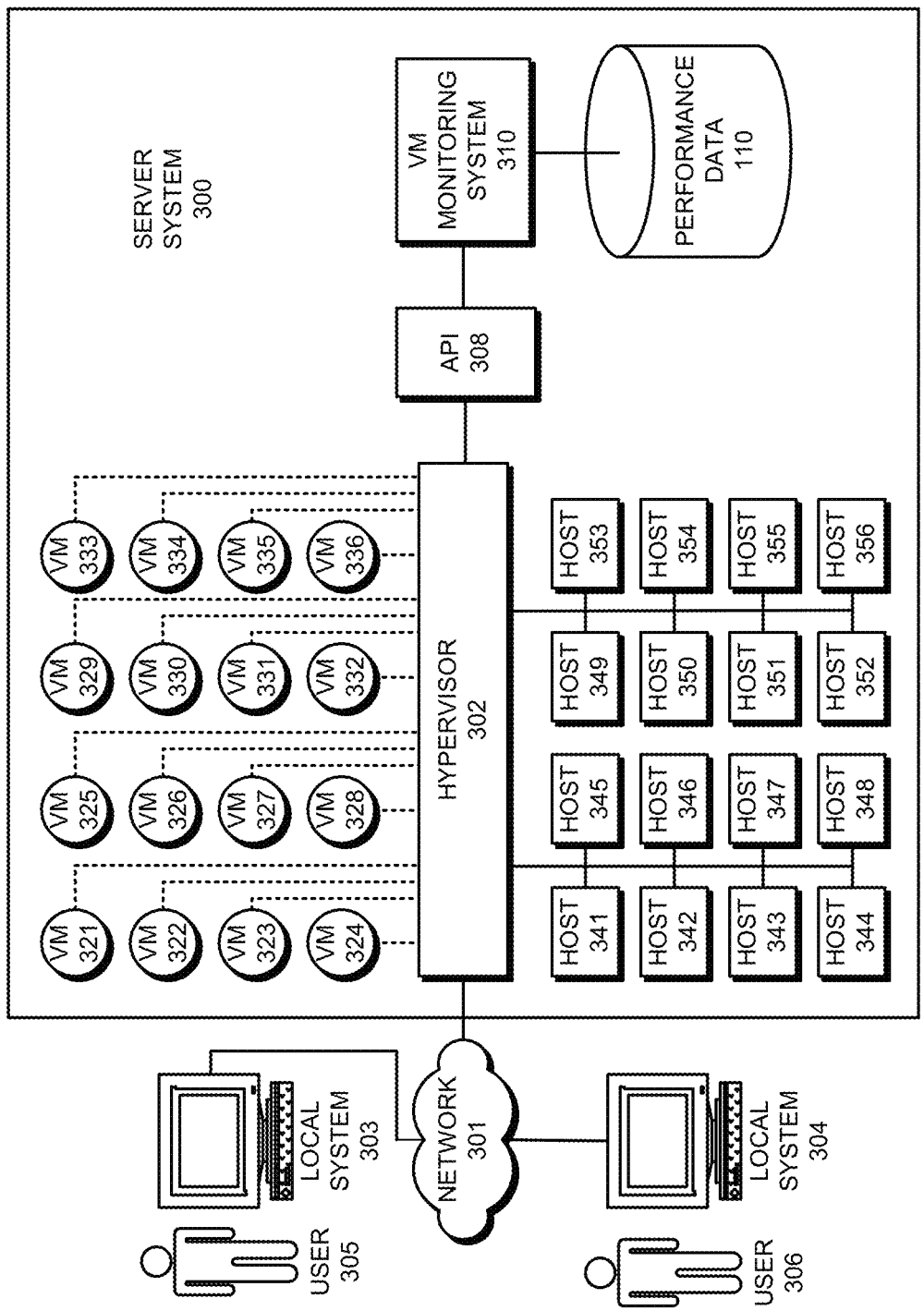
FIG. 3 illustrates a system that facilitates executing virtual machines in accordance with the disclosed embodiments.

FIG. 3 illustrates an exemplary server system 300 that monitors the performance of a virtual machine environment comprising a set of virtual machines and associated host systems in accordance with the disclosed embodiments. As illustrated in FIG. 3, server system 300 is accessed by local systems 303 and 304 through network 301. Server system 300 can generally include a set of computational resources, such as a cloud-based computer system comprising one or more geographically distributed data centers. Local systems 303 and 304 can generally include any type of computer system that can interact with server system 300. For example, local systems 303 and 304 can include a personal computer system, a server computer system, a laptop computer system, or a smartphone. Network 301 can generally include any type of network for connecting computer systems. For example, network 301 can be a private network with dedicated communication links; a public network, such as the Internet; or a virtual-private network (VPN) that operates over a public network.

Local systems 303 and 304 include applications (not shown) which are operated by users 305 and 306, respectively. (Note that these applications can be native applications or browser-based applications.) During operation, these applications in local systems 303 and 304 can offload computational tasks to server system 300 through interactions with a hypervisor 302. Hypervisor 302 controls the operation of a set of virtual machines 321-336 that execute computational tasks on a set of underlying physical host systems 341-356. Host systems 341-356 can generally include any type of single-core or multi-core computer system including associated memory resources that can be used to execute computational tasks.

Hypervisor 302 assigns tasks to be executed on specific virtual machines or sets of virtual machines based on the task's requirements, the virtual machine's capabilities, and the load on the virtual machines. Hypervisor 302 also assigns virtual machines to be executed on underlying physical host systems based on the load on the underlying host systems and computational requirements of the virtual machines.

During operation, hypervisor 302 records values for a number of performance metrics for virtual machines 321-336 and host systems 341-356 and makes these performance metric values available through an application programming interface (API) 308.

Figure 4A:
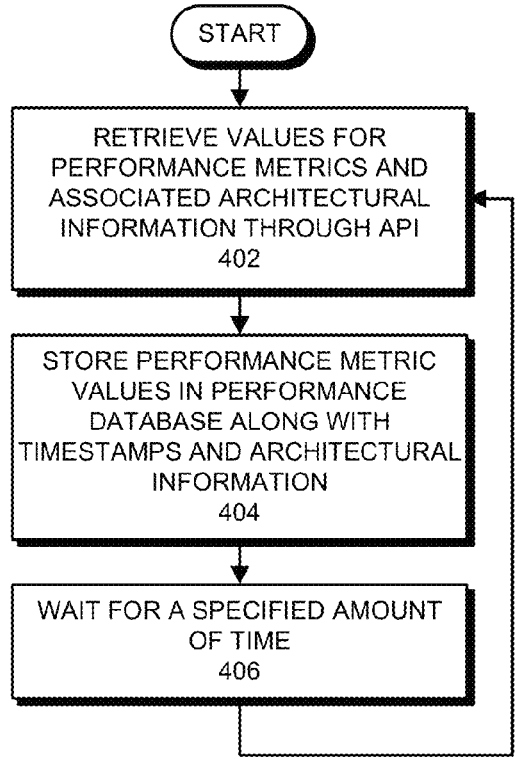
FIG. 4A presents a flowchart illustrating how performance metrics can be collected in accordance with the disclosed embodiments.

Virtual machine (VM) monitoring system 310 periodically makes calls through API 308 to retrieve values for these performance metrics and then stores them in a database containing performance data 110. More specifically, referring to the flowchart illustrated in FIG. 4A, VM monitoring system 310 retrieves values for a set of performance metrics by making calls through API 308 (step 402). Note that API 308 provides various methods or functions to retrieve values for the performance metrics. In one embodiment, API 308 is an API provided as part of the vSphere Hypervisor™ system distributed by VMware, Inc. of Palo Alto, Calif. While retrieving values for the performance metrics from hypervisor 302 through API 308, VM monitoring system 310 also retrieves architectural information specifying one-to-many relationships between entities in the computing environment. For example, this architectural information can specify which virtual machines execute on each host, which hosts belong to each cluster, and which clusters belong to each virtual cluster.

Next, VM monitoring system 310 stores the retrieved values for the performance metrics and associated timestamps along with the architectural information in database 110 (step 404). Then, VM monitoring system 310 waits for a specified amount of time (406), and returns to step 402 to retrieve the next set of performance metric values.

Process of Generating a Proactive Monitoring Tree

Figure 4B:
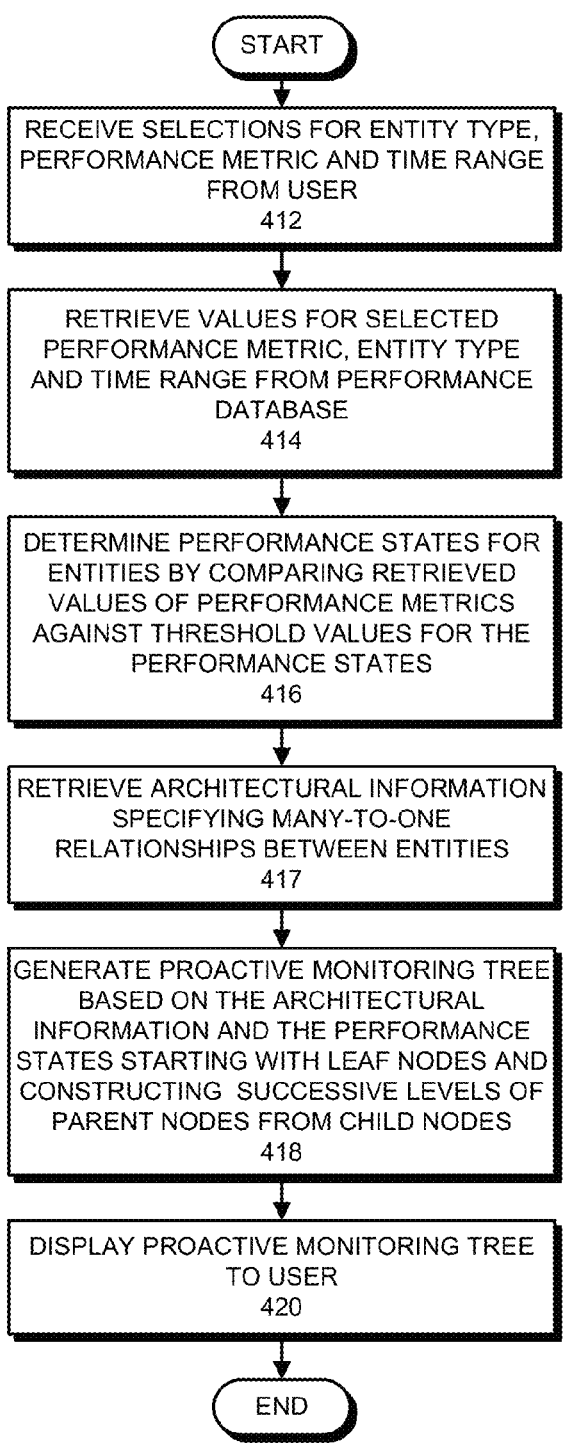
FIG. 4B presents a flowchart illustrating how a proactive monitoring tree can be generated in accordance with the disclosed embodiments.

FIG. 4B presents a flowchart illustrating how a proactive monitoring tree 106 is generated by a performance-monitoring tool 108 in accordance with the disclosed embodiments. Performance-monitoring tool 108 starts with a database containing performance data 110 for a set of entities (e.g., virtual machines and hosts), where database 110 was previously generated as described above with reference to FIG. 4A.

First, the system receives a number of selections from a user, including: an entity type (e.g., virtual machine or host), a performance metric (e.g., CPU utilization) and a time range (e.g., the past 24 hours) (step 412). Next, the system accesses database 110 and retrieves values for the selected performance metric, entity type and time range (step 414). For example, if database 110 includes fields for performance metric, entity type, entity identifier, and measurement time, the retrieval process can involve executing a query against database 110. This query retrieves values for the selected metric (and associated entity identifiers) that match the specific entity type and time range. In one embodiment, database 110 is optimized to quickly return metric values for a specific time range. For example, database 110 can store events for the performance metric in a time-series index, wherein events are stored and can be accessed based on their timestamps.

Next, the system uses the obtained metric values to determine performance states for the associated entities. This can be accomplished by comparing the metric values against a set of threshold values for the performance states (step 416).

The system also retrieves the architectural information specifying the many-to-one relationships between the entities at the time the performance metric values were gathered (step 417).

The system then generates the proactive monitoring tree based on the determined performance states. This process can involve starting from the leaf nodes and constructing successive levels of parent nodes from child nodes (step 418). For example, the system can start with the leaf nodes, wherein each leaf node is associated with a performance state for its associated entity (e.g., virtual machine or host system). Next, the performance state for each parent node can be determined based on the worst-case performance state for each of its child nodes. This process is repeated until the root node of the tree is reached.

Finally, the system displays the proactive monitoring tree to the user and allows the user to navigate the proactive monitoring tree to analyze performance problems (step 420).

Proactive Monitoring Tree Features

In some embodiments, proactive monitoring tree 106 provides a number of features, including: (1) severity state sorting, (2) a state distribution ring, (3) a distribution stream chart with branch overlay, and (4) a pin board that displays detail panels for nodes. These features are described in more detail below.

Severity State Sorting

In some embodiments, branches of the proactive monitoring tree are sorted based a count of the most severe nodes in that branch. Hence, the branch with the highest number of the highest severity leaf nodes will be displayed on the far left-hand side of the tree. For example, in a system that associates entities with a critical state, a warning state, a normal state and an unknown state, the branch with the highest number of leaf nodes in the critical state will be displayed at the far left-hand side of the tree. If there are no leaf nodes in the critical state, the branch with the highest number of leaf nodes in the warning state will displayed at the far left-hand side of the tree.

This sorting process is performed top down. Hence, branches of the root node of the tree are first sorted based on the highest count of highest severity leaf nodes. Then, branches of each branch node are sorted in the same way. Hence, branches with the highest number of high severity leaf nodes are always displayed on the far left-hand side of the tree.

Figure 5A:
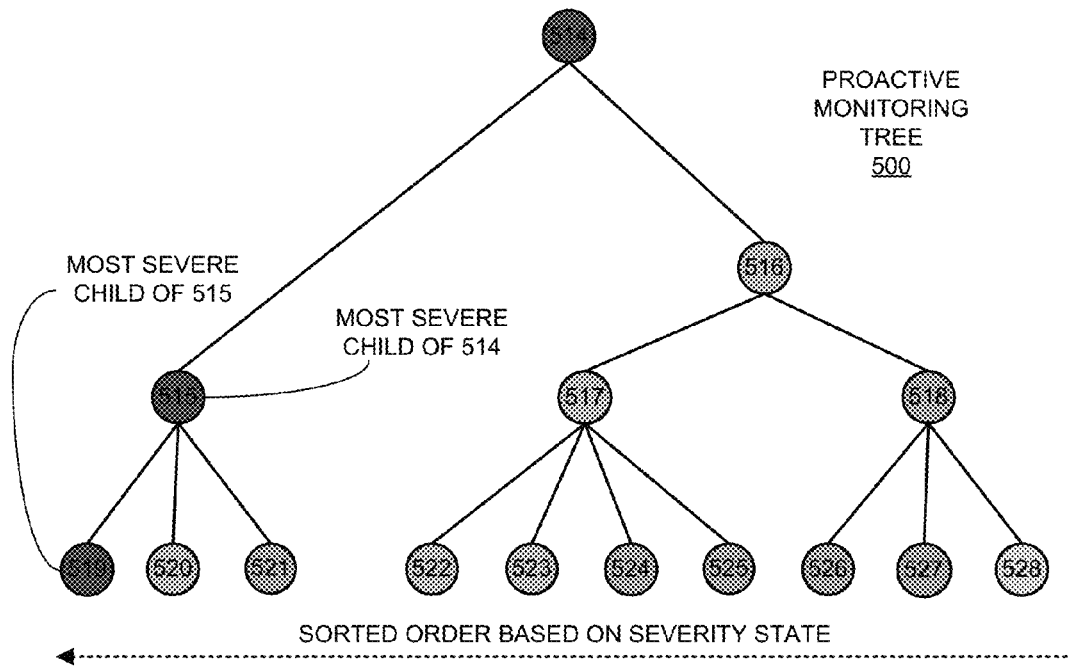
FIG. 5A illustrates a sorted proactive monitoring tree in accordance with the disclosed embodiments.

For example, in FIG. 5A, the tree 500 comprises nodes 514-528, wherein node 514 is the root node. The most severe branch node 515 under root node 514 is displayed on the far left-hand side of root node 514. This means that branch node 515 is associated with the most leaf nodes having the highest severity state. Similarly, leaf node 519 has the highest severity state of all leaf nodes under branch node 515. Sorting the branches in this way enables a user to easily determine which branches in the tree are experiencing the most performance problems.

Figure 5B:
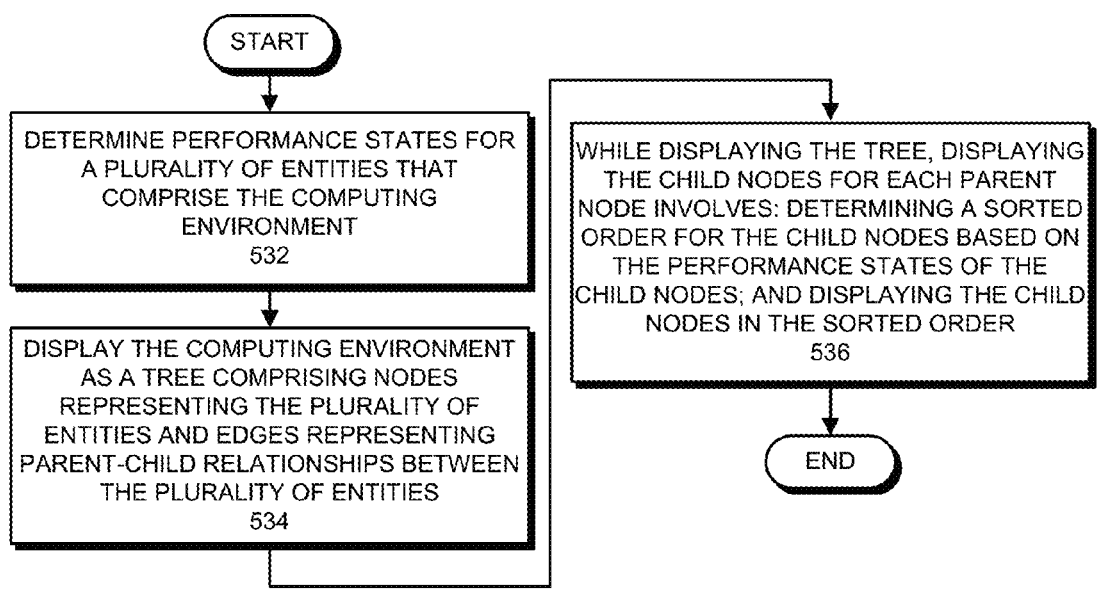
FIG. 5B presents a flowchart illustrating how nodes in a proactive monitoring tree can be sorted and displayed in accordance with the disclosed embodiments.

FIG. 5B presents a flowchart illustrating how tree nodes are displayed in sorted order in accordance with the disclosed embodiments. During operation, the system first determines performance states for a plurality of entities that comprise the computing environment (step 532). This can involve first determining values for a performance metric of each of the entities and then comparing the determined values against thresholds to determine the performance states for the entities. Next, the system displays the computing environment as a tree with nodes representing the plurality of entities and edges representing parent-child relationships between the plurality of entities (step 534). While displaying the tree, the system displays the child nodes for each parent in sorted order based on values of the performance states associated with the child nodes (step 536).

State Distribution Ring

The state distribution ring can be implemented as a ring surrounding parent nodes of the tree. This ring provides an indicator of the distribution of performance states for the leaf nodes that fall under the parent node in the tree. More specifically, the ring is divided into visually distinct sections associated with different performance states, wherein the visually distinct sections are sized proportionately with the determined counts of leaf nodes with the associated performance states. Note that the visually distinct sections can be displayed using different colors or different patterns. In this way, the user can get a sense of the proportion of leaf nodes in a particular performance state for a particular branch of the hierarchy. This can help a user in determining which nodes they might be interested in clicking on to investigate. A node with a higher proportion of leaf nodes in a more severe state is probably more interesting to investigate.

Figure 6A:
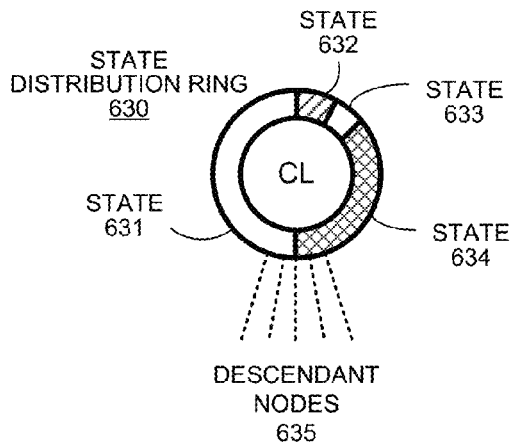
FIG. 6A illustrates an exemplary state distribution ring in accordance with the disclosed embodiments.

For example, FIG. 6A illustrates a state distribution ring 630, which surrounds a node for a cluster (CL) associated with a number of descendant nodes 635, including branch nodes and leaf nodes. State distribution ring 630 is divided into visually distinct sections 631-634 which are sized proportionately with the counts of leaf nodes with the associated performance states.

Figure 6B:
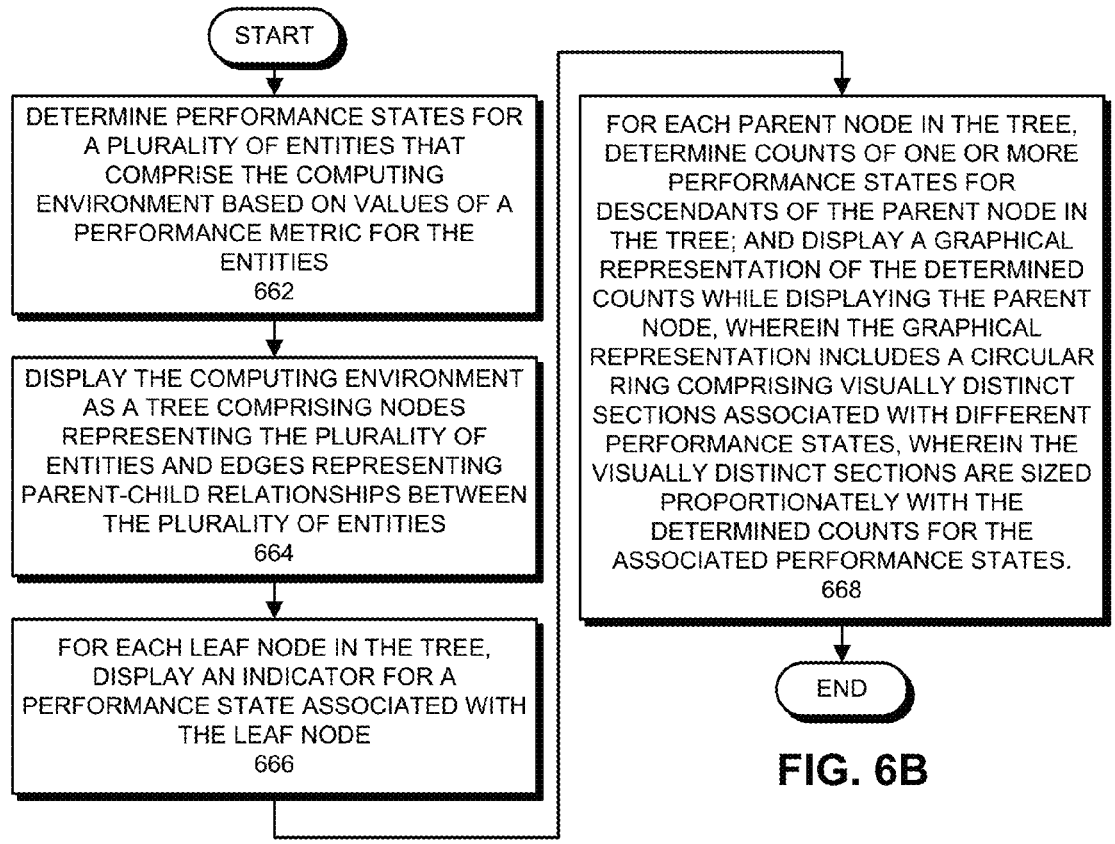
FIG. 6B presents a flowchart illustrating how a state distribution ring can be displayed in accordance with the disclosed embodiments.

More specifically, FIG. 6B presents a flowchart illustrating how a state distribution ring is displayed in accordance with the disclosed embodiments. During operation, the system determines performance states for a plurality of entities that comprise the computing environment based on values of a performance metric for the entities (step 662). In some embodiments, the system determines the performance states for the plurality of entities by comparing the values of the performance metric for the plurality of entities against one or more state-specific threshold values to determine the associated performance states for the plurality of entities.

Next, the system displays the computing environment as a tree comprising nodes representing the plurality of entities and edges representing parent-child relationships between the plurality of entities (step 664). For each leaf node in the tree, the system displays an indicator for a performance state associated with the leaf node (step 666). For each parent node in the tree, the system determines counts of one or more performance states for descendants of the parent node in the tree and then displays a graphical representation of the determined counts while displaying the parent node. In some embodiments, displaying this graphical representation involves displaying a circular ring comprising visually distinct sections associated with different performance states, wherein the visually distinct sections are sized proportionately with the determined counts for the associated performance states (step 668).

Distribution Stream Chart with Branch Overlay

Figure 7A:
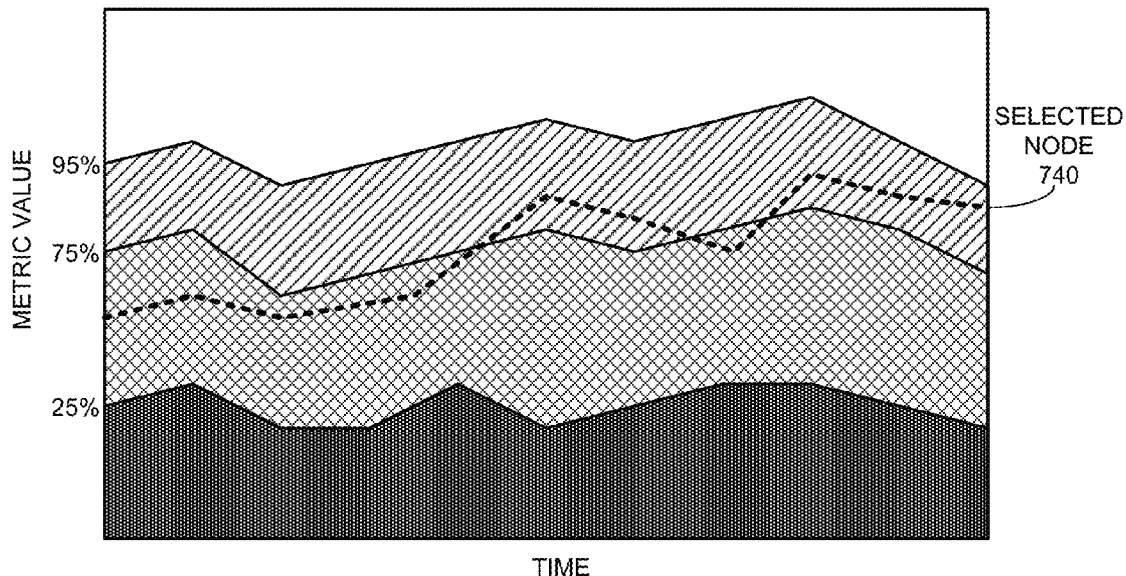
FIG. 7A presents a performance graph for a branch of the tree overlaid on a distribution of the performance metric over nodes in the tree in accordance with the disclosed embodiments.

In some embodiments, when a user hovers a cursor over a node in the tree, a special distribution stream chart appears as is illustrated in FIG. 7A. In the foreground, this chart displays a line for the selected node 740 that represents the average values for the selected metric for the node. If the node is a leaf node, the line represents the average for the leaf node. If the selected node is a parent node, the line represents the average values of the metric over all leaf nodes under the parent node. (Alternatively, instead of displaying a line for the average value of the leaf nodes, the system can allow the user to scroll through lines for each of the leaf nodes under the parent.)

The background of the chart represents the distribution of the selected metric's values over a reference set of nodes in the tree. This reference set of nodes can include the entire tree or merely a subset of nodes in the tree. This distribution is represented by a number of shaded regions. The interior, cross-hatched region represents the middle 50% of the data. This interior region is therefore defined as having edges representing the $25^{th}$ percentile of the data and the $75^{th}$ percentile of the data. (Note that this is analogous to the box portion of a box-and-whisker plot.) The lower exterior, darker-shaded region has a lower bound of the minimum value of the data, the $0^{th}$ percentile if you will, and an upper bound at the $25^{th}$ percentile line. The upper exterior region is upper-bounded by the $95^{th}$ percentile line and lower-bounded by the $75^{th}$ percentile line. Note that the upper bound in a box-and-whisker plot is typically the maximum value of the data. However, this can be greatly affected by outliers; hence, the illustrated embodiment limits the upper region to the $95^{th}$ percentile of the data. Note that the boundaries in the distribution are not meant to be limited to the $0^{th}$, $25^{th}$, $75^{th}$ and $95^{th}$ percentiles. In general, the maximum value, other percentile values and other measures, such as standard deviations, can be used.

In a variation on this embodiment, if the selected node is a parent node, instead of displaying the average value of the metric over all leaf nodes under the parent, the system can display a foreground distribution for the leaf nodes under the parent. This foreground distribution is overlaid on a background distribution for the selected metric over all nodes in the tree. (This overlaying process may involve using different colors or different levels of transparency and translucency.)

The value of this chart is that a user can see how performance for a particular branch of the hierarchy compares to the entirety of the tree. This enables the user to make inferences based on the behavior of a particular branch deviating from the distribution of the computing environment as a whole, and these inferences can help the user optimize performance of the computing environment.

Figure 7B:
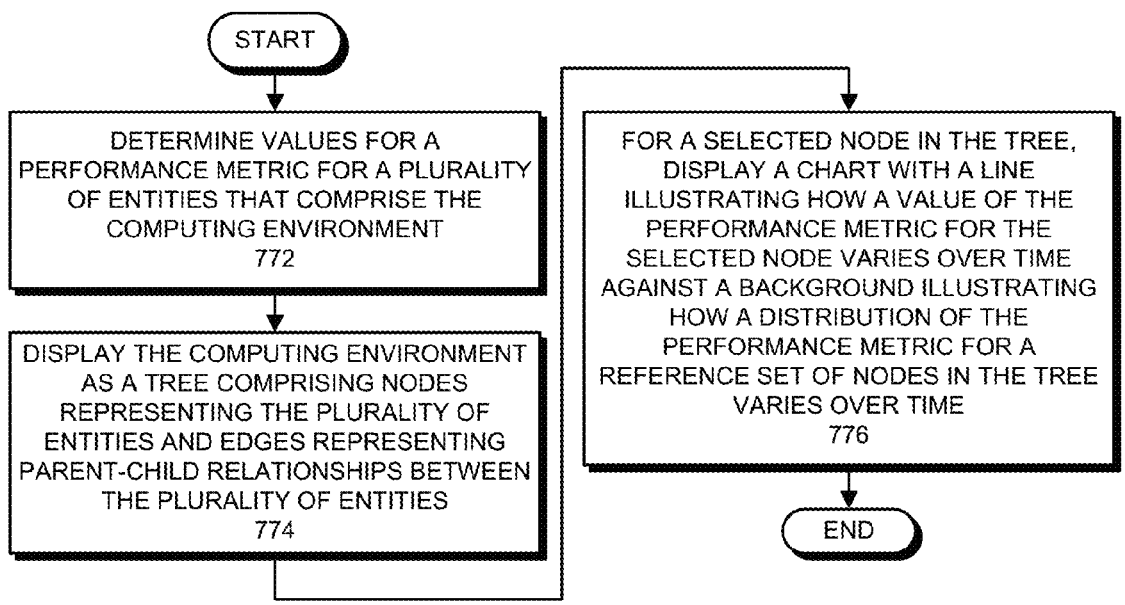
FIG. 7B presents a flowchart illustrating how the graph illustrated in FIG. 7A can be generated in accordance with the disclosed embodiments.

More specifically, FIG. 7B presents a flowchart illustrating how the graph illustrated in FIG. 7A is generated in accordance with the disclosed embodiments. First, the system determines values for a performance metric for a plurality of entities that comprise the computing environment (step 772). Next, the system displays the computing environment as a tree comprising nodes representing the plurality of entities and edges representing parent-child relationships between the plurality of entities (step 774). Then, for a selected node in the tree, the system displays a chart with a line illustrating how a value of the performance metric for the selected node varies over time against a background illustrating how a distribution of the performance metric for a reference set of nodes in the tree varies over time (step 776). Note that if the selected node is a parent node, the value of the performance metric for the selected node is an average value for the performance metric across descendant nodes of the selected node in the tree. Moreover, the background includes a stream chart comprising regions associated with percentile ranges, wherein borders between the regions represent one or more of the following: a minimum value line, a $25^{th}$ percentile line, a $50^{th}$ percentile line, a $75^{th}$ percentile line, a $95^{th}$ percentile line, a maximum value line, and a line associated with a standard deviation.

Node Pinning

Figure 8A:
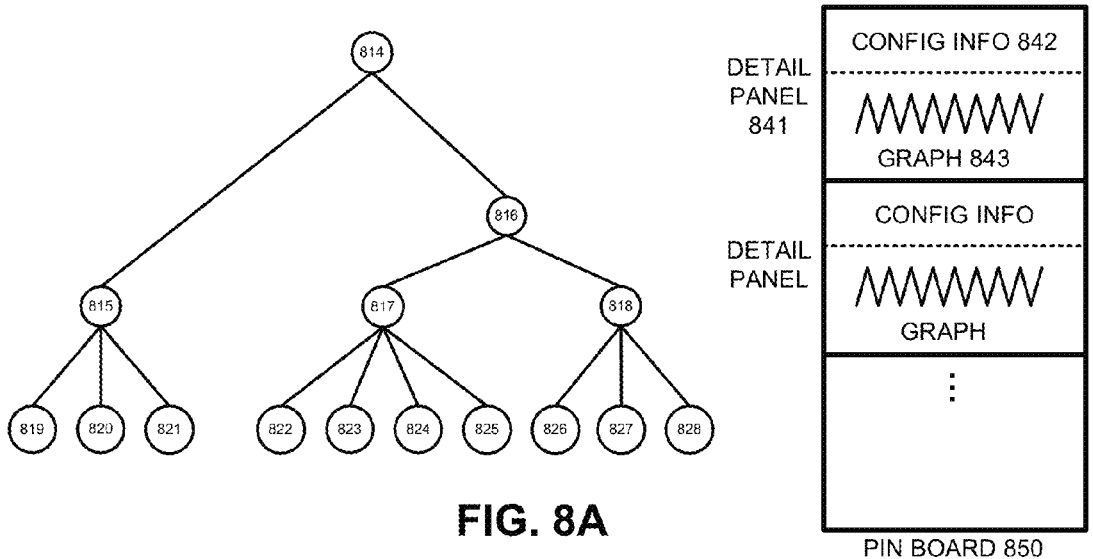
FIG. 8A illustrates a system that facilitates node pinning in accordance with the disclosed embodiments.

FIG. 8A illustrates how a performance state of a node in the tree can be "pinned" onto a pin board to facilitate comparisons with the states of other nodes in the tree in accordance with the disclosed embodiments. For example, when a user hovers a cursor over a node (say node 814), a pin icon is displayed in a tooltip. If the user clicks on the pin icon, a detail panel for the node is displayed on a pin board 850 located on the far right-hand side of the screen. Note that the state of this detail panel is frozen at the time of pinning. This means that the user can manipulate the tree, for example by changing the performance metric, time range or entity type, and this pinned detail panel remains unchanged. The user can then pin another node, or can pin the same node for a different metric to pin board 850. This enables the user to compare different performance metrics simultaneously. An exemplary node detail panel 841 can include configuration information 842 for the entity associated with the node, and can also display a graph 843 for the selected metric, such as a graph of CPU utilization over time.

The content of the pinned detail panel 841 can vary as a function of the type of node pinned. For example, the detail panel for a host system can show information specifying that host's manufacturer and the number of network interface cards and processors, while a detail panel for a virtual machine can show information associated with provisioning of the virtual machine, the guest OS running on it, etc. As mentioned above, the second portion of the pinned detail panel can display a graph for a selected metric. However, if the pinned node is a branch node, instead of showing a distribution stream chart for the node, the system can display a table with the top 50 most critical children in the branch, wherein each entry in the table includes an indicator of the performance state of the node, the name of the node, and a sparkline for the selected metric value for that node over the selected time range.

Figure 8B:
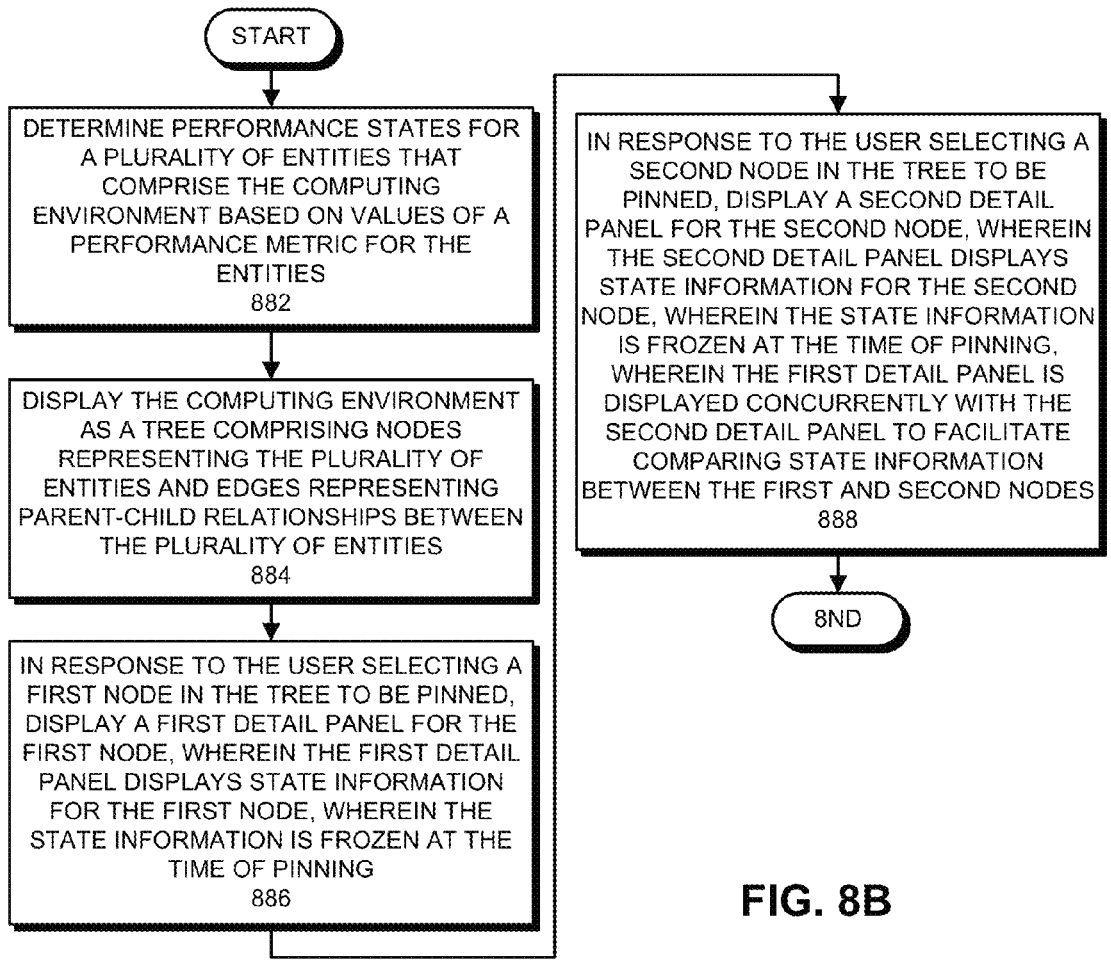
FIG. 8B presents a flowchart illustrating the process of displaying a pin board for a proactive monitoring tree in accordance with the disclosed embodiments.

FIG. 8B presents a flowchart illustrating how a pin board is displayed in accordance with the disclosed embodiments. During operation, the system determines performance states for a plurality of entities that comprise the computing environment based on values of a performance metric for the entities (step 882). Next, the system displays the computing environment as a tree comprising nodes representing the plurality of entities and edges representing parent-child relationships between the plurality of entities (step 884). Then, in response to the user selecting a first node in the tree to be pinned, the system displays a first detail panel for the first node, wherein the first detail panel displays state information for the first node, wherein the state information is frozen at the time of pinning (step 886). Next, in response to the user selecting a second node in the tree to be pinned, the system displays a second detail panel for the second node, wherein the second detail panel displays state information for the second node, wherein the state information is frozen at the time of pinning (step 888). Note that displaying the first detail panel concurrently with the second detail panel facilitates comparing state information between the first and second nodes.

Monitoring Tree for a Virtual Machine Environment

We next present some exemplary screen shots for a proactive monitoring tree representing a virtual machine environment. This monitoring tree includes nodes for various entities in the virtual machine environment. More specifically, these entities include: a physical host system (HS), a virtual machine (VM); a cluster comprising one or more host systems (CL); and a virtual center comprising one or more clusters (VC). In some embodiments, the virtual machines are automatically load-balanced among hosts in a cluster, wherein virtual machines assigned to stand-alone hosts remain on the stand-alone hosts permanently.

Figure 9A:
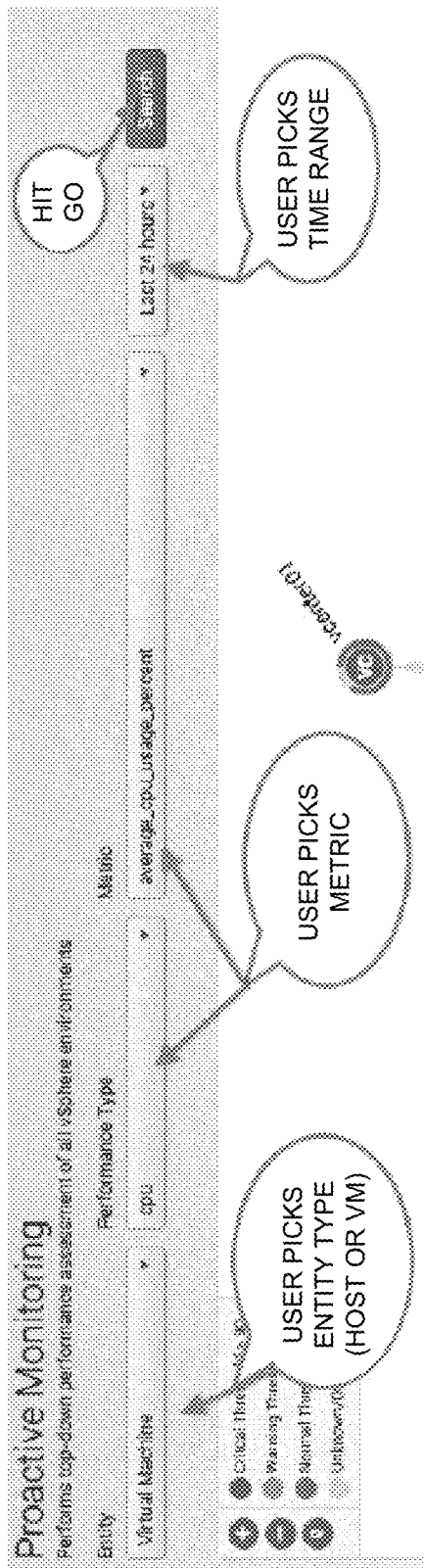
FIG. 9A illustrates a metric-selection screen in accordance with the disclosed embodiments.

Before the proactive monitoring tree can be displayed, the user selects a number of parameters for the tree as is illustrated in FIG. 9A. The illustrated parameters include: (1) an entity type of "virtual machine;" (2) a performance type of "CPU;" (3) an associated metric of "average CPU usage;" and (4) a time range of "last 24 hours." This causes the system to aggregate the selected performance metric over the selected time range for all matching entities of the selected entity type in the virtual machine environment. For example, this can involve taking an average (or some other aggregation) of performance metric values for each entity over the selected time range. Moreover, in a virtual-machine environment, the selected entity type can be a "virtual machine" or a "host system," and the selection changes whether the leaf nodes represent virtual machines or host systems. This is significant, because the system gathers direct performance measurements for the leaf nodes whose states bubble up to parent nodes and are displayed in the parent nodes' associated rings. Next, the system compares the aggregated values against a set of user-defined thresholds to determine "performance states" for the entities, wherein the performance states are displayed using different colors. More specifically, the performance states for a specific entity can be: a critical state (red), a warning state (orange), a normal state (green), or an unknown/offline state (gray).

Figure 9B:
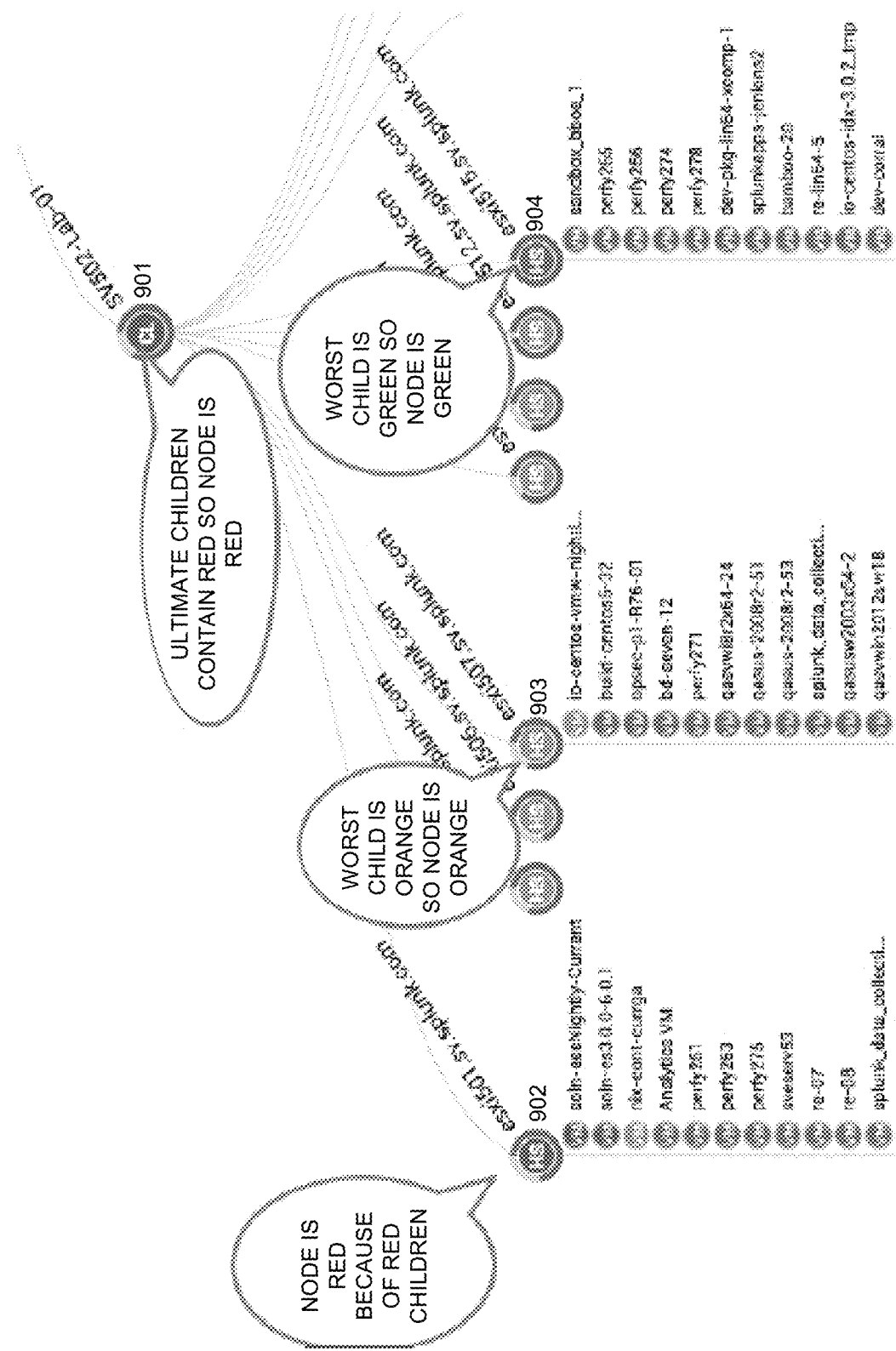
FIG. 9B illustrates a tree with parent nodes that are colored based on the performance states of their child nodes in accordance with the disclosed embodiments.

The system then displays a proactive monitoring tree for the selected performance metric as is illustrated in FIG. 9B. The highest-level node in the tree illustrated in FIG. 9B is a cluster node 901, which is colored red to indicate that the ultimate children (leaf nodes) of cluster node 901 contain at least one node in the critical state. Cluster node 901 has a number of child nodes representing physical host systems, including: node 902, colored red to indicate that at least one of its child nodes is red; node 903, colored orange to indicate that its worst child node is orange and none of its child nodes are red; and node 904, colored green to indicate that its worst child node is green and none of its child nodes are red or orange. Note that when the user clicks on a node, the node expands to reveal its child nodes at a lower level of the tree.

For each parent node in the tree, the system computes counts of the performance states for all of the leaf nodes under the parent node. This can involve maintaining an array for each node containing counts of states of the leaf nodes associated with each node or branch in the tree [red, orange, green, gray]. In the case of a leaf node, the array for a leaf node includes a single "1" value for the performance state of the leaf node. The array for a parent node is computed by adding the arrays for all immediate descendants of the parent node.

Figure 9C:
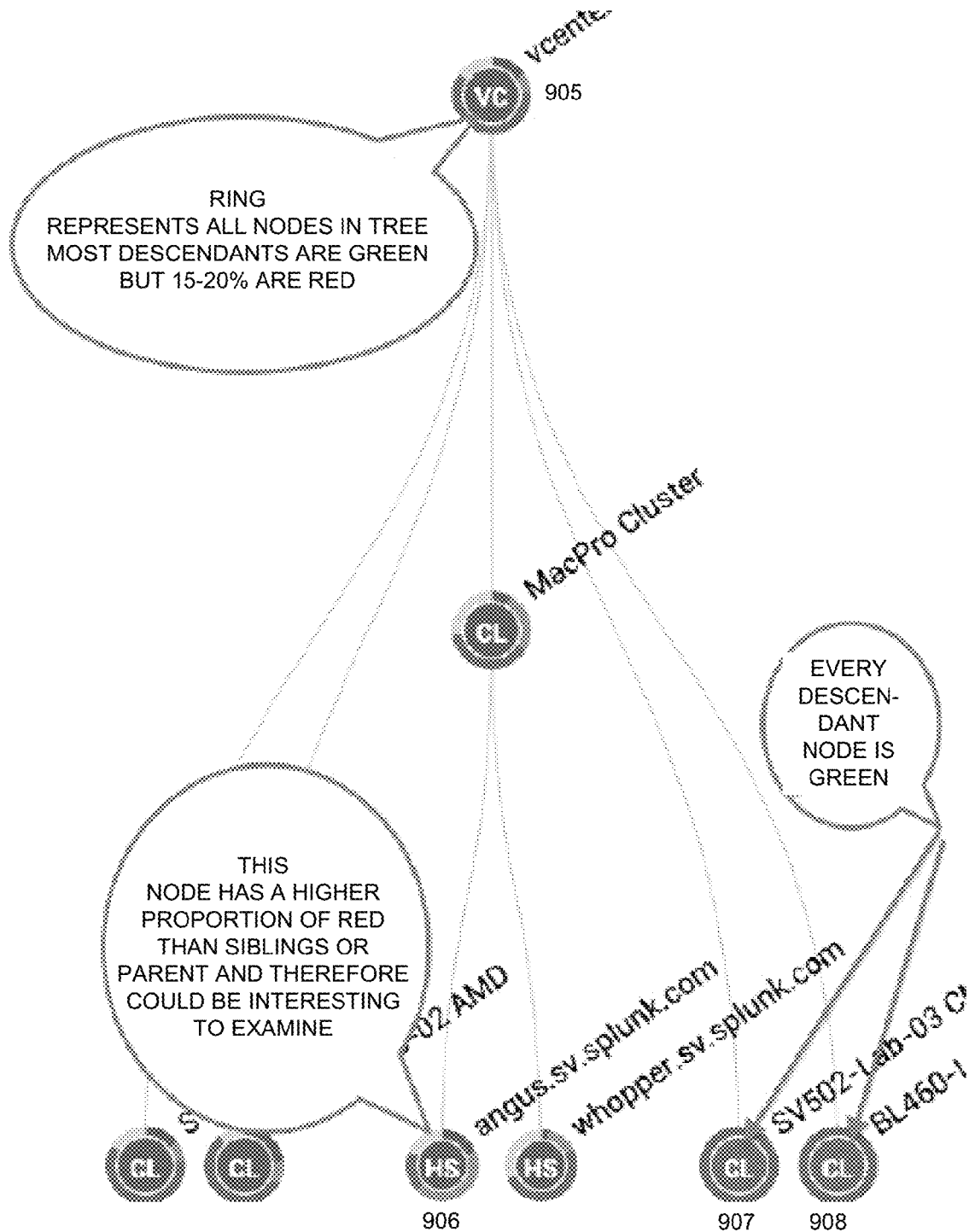
FIG. 9C illustrates a tree with state distribution rings in accordance with the disclosed embodiments.

Around each node in the tree, the system displays a state distribution ring comprising visually distinct sections associated with different performance states, wherein the visually distinct sections are sized proportionately with the determined counts for the associated performance states. For example, in FIG. 9C, node 905 is the root node of a tree, which is surrounded by a ring with colored sections that represent the proportions of states of the leaf nodes in the tree. Note that 15-20% of this ring is red, which indicates that 15-20% of the leaf nodes in the tree are red. Nodes 907-908 are surrounded by rings that are completely green, which indicates that all of their descendant nodes are green. Node 906 actually has a higher proportion of red nodes than its siblings or parent. However, it does not have the largest number of red nodes of its siblings and hence does not appear on the far left-hand side of the tree in the sorted ordering of the siblings. Nevertheless, node 906 may be interesting to examine because of its higher proportion of red nodes.

Figure 9D:
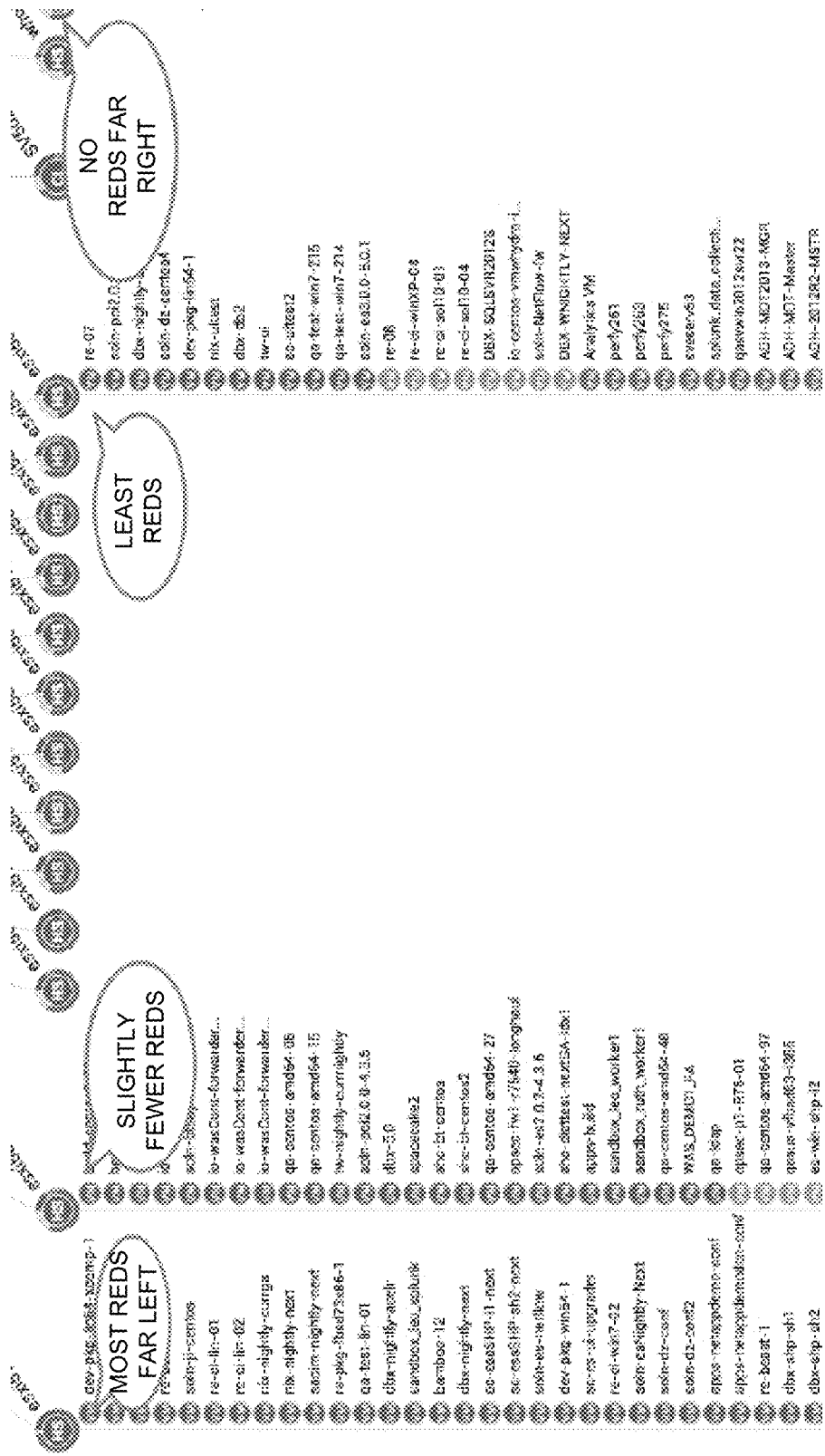
FIG. 9D illustrates a tree with sorted nodes in accordance with the disclosed embodiments.

As mentioned above, the nodes of the proactive monitoring tree are organized in sorted order based on the states of the nodes. This sorting can be accomplished as follows. We first look at virtual centers (if there are more than one), and the virtual center with the most reds is displayed on the far left-hand side of the display. Then, within that virtual center, we look at the clusters, and the cluster with the most reds in its branch goes on the far left. Then, within that cluster, we go to the host system level, and the host system with the most reds within that cluster goes on the far left. Finally, within the leaves we sort the leaves red to orange to green to gray. If a branch has no reds, it is always sorted after a node with at least one red, and then its count of oranges is compared against the other siblings with no reds; if a branch has no oranges, it always falls behind anything with at least one orange. This sorting system works in conjunction with the rings mentioned above to allow the user to quickly determine where to look for performance problems. The branches with the most reds and the highest proportion of reds are typically the most interesting to investigate. For example, the sorted ordering for an exemplary set of sibling nodes is illustrated in FIG. 9D. The sibling with the most reds appears on the far left. The sibling with no reds appears to the far right and all the nodes in between are sorted based on the number of reds they represent.

Figure 9E:
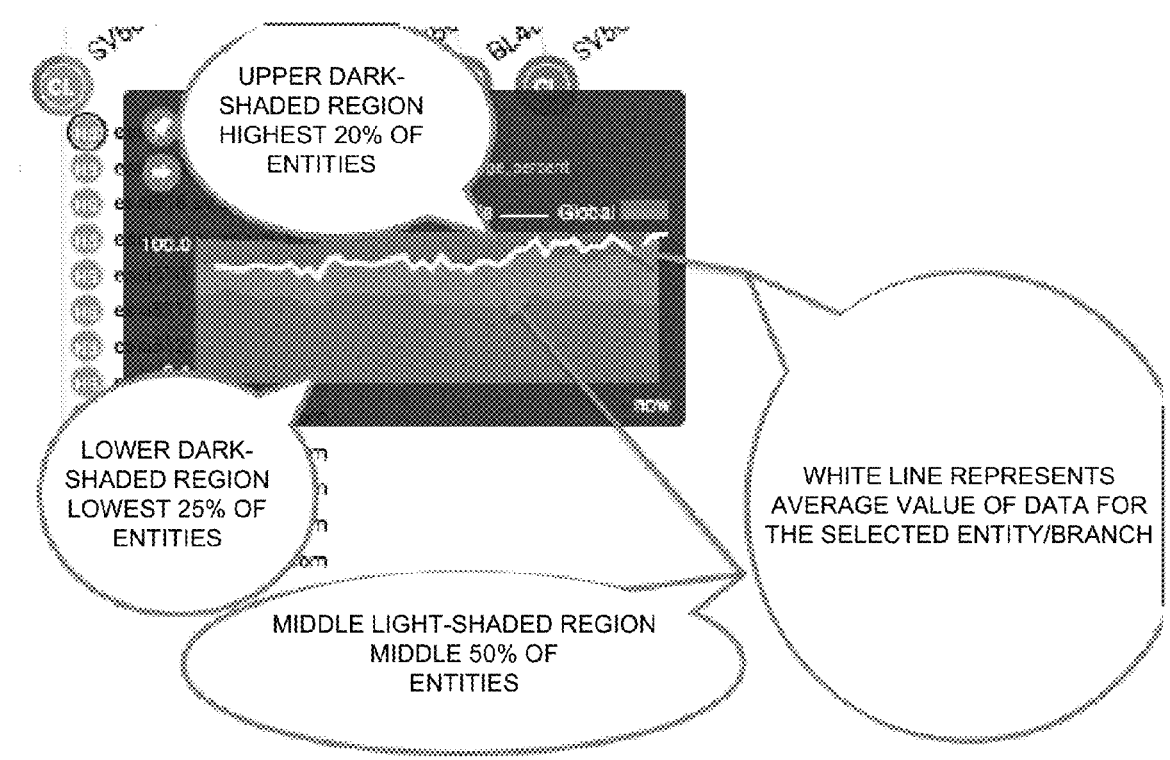
FIG. 9E illustrates another example of the graph illustrated in FIG. 9D in accordance with the disclosed embodiments.

FIG. 9E presents an exemplary distribution stream chart with a branch overlay. In this chart, the white line illustrates an average value for the selected branch or entity, the middle light-shaded region represents the middle 50% of the entities in the tree, the lower dark-shaded region represents the lower 25% of the entities, and the upper dark-shaded region represents the 20% of the entities below the top 5% of the entities.

Figure 9F:
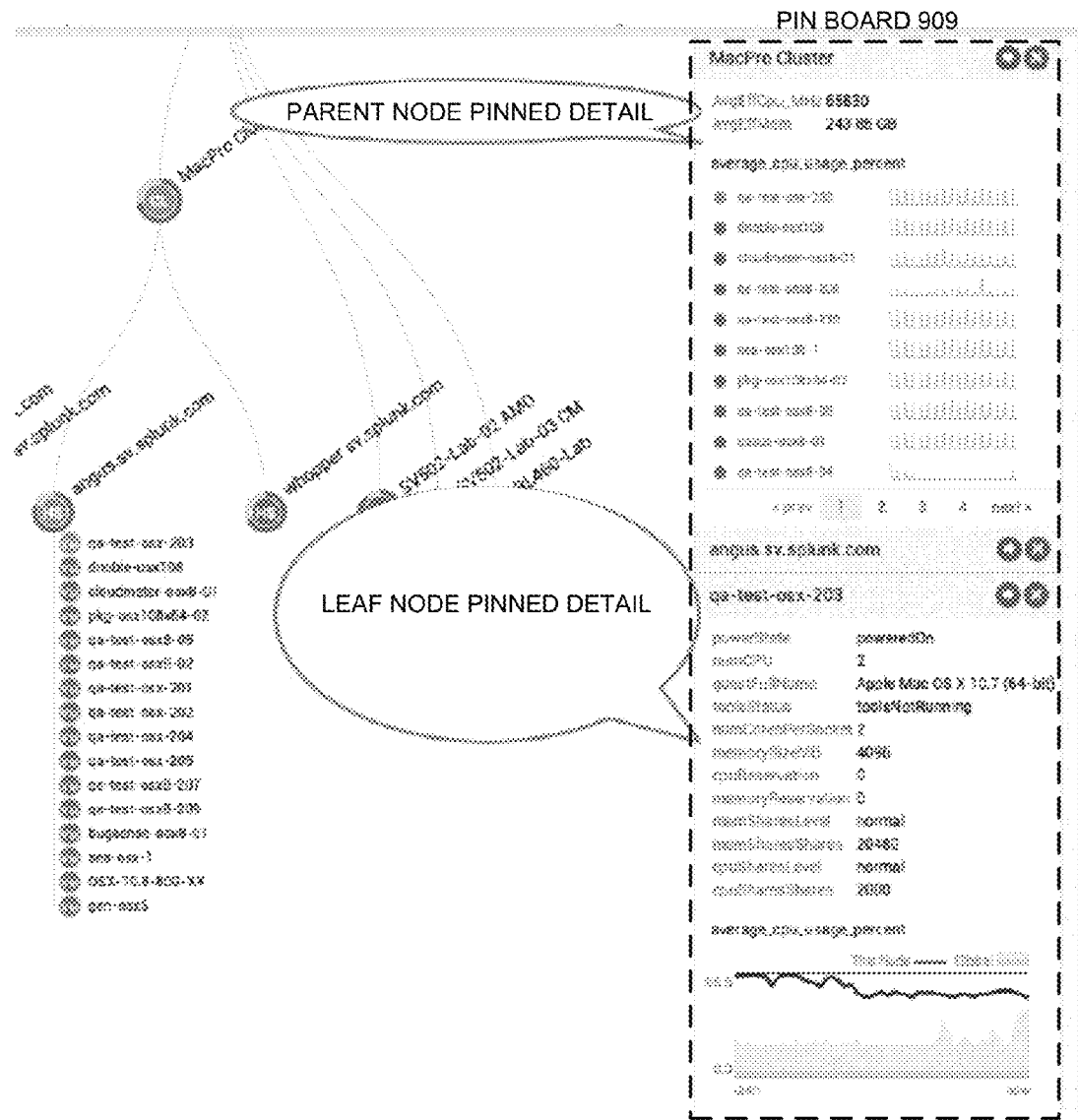
FIG. 9F illustrates an exemplary pin board in accordance with the disclosed embodiments.

Finally, FIG. 9F illustrates an exemplary pin board 909 with two detail panels. The lower detail panel represents a leaf node. It displays various configuration information for the leaf node, such as the power state and number of CPUs. It also displays a graph for the selected metric, which is overlaid on a distribution for the selected metric across all nodes in the tree. In contrast, the upper detail panel represents a parent node. This parent panel displays configuration information, such as the average effective CPU frequency in megahertz and the average effective memory, for all leaf nodes under the parent node. It also displays a sparkline for the selected performance metric for each of the leaf nodes under the parent node. These sparklines illustrate how the selected performance metric varies over time.

Process of Gathering Data

We now provide additional details about how performance data can be gathered. In general, this data-gathering process can be used to gather any type of performance data from any type of system that produces performance data, such as a computer system, an aircraft, a nuclear reactor or a even financial-trading system. In particular, the data-gathering process can be applied to gather data in the virtual memory monitoring system 210 illustrated in FIG. 2 above.

There is tremendous growth in the amount of data generated in the world. With decreasing storage costs and seemingly infinite capacity due to cloud services, there are fewer reasons to discard old data, and many reasons to keep it. As a result, challenges have shifted towards extracting useful information from massive quantities of data.

Mining a massive dataset is non-trivial but a more challenging task is to cross-correlate and mine multiple datasets from various sources. For example, a datacenter monitors data from thousands of components; the log format and collection granularities vary by component type and generation. The only underlying assumption that can be made is that each component has a notion of time, either via timestamps or event sequences, that is captured in the logs. As the quantity and diversity of data grow, there is an increasing need for performing full text searches to mine the data.

Another challenge is that a large fraction of the world's data is unstructured, making it difficult to index and query using traditional databases. Even if a dataset is structured, the specifics of the structure may evolve with time, for example, as a consequence of system upgrades or more/less restrictive data collection/retention policies.

SPLUNK® ENTERPRISE is software produced and sold for on-premise and cloud use by Splunk Inc. of San Francisco, Calif. SPLUNK ENTERPRISE is a comprehensive system that generates, stores, retrieves, and searches event data. SPLUNK® ENTERPRISE has gained particular appeal in the market for deriving events from unstructured data and machine data. It is the leading software for providing real-time operational intelligence, enabling organizations to collect, index, and harness machine-generated big data coming from the websites, applications, servers, networks, mobile devices, etc., that power their businesses.

At a high level, SPLUNK® ENTERPRISE can take raw data, unstructured data, or machine data such as data in Web logs, syslogs, sensor readings, etc., divide the data up into portions, and optionally transform at least part of the data in these portions to produce time-stamped events. The software derives the time stamp for each event by extracting it from the event data itself or by interpolating an event's time stamp relative to other events for which the software can derive a time stamp. SPLUNK® ENTERPRISE then stores the events in a time-series data store against which it can run queries to retrieve events that meet specified criteria, such as having certain keywords and/or having certain value(s) for certain defined field(s).

SPLUNK® ENTERPRISE is particularly noteworthy for employing a so-called "late-binding schema." As noted, an event in SPLUNK® ENTERPRISE typically contains a portion of raw data (or a transformed version of such). To run queries against events other than those involving keyword searches, a schema can be developed. Such a schema can include extraction rules for one or more fields. Each field can be defined for a subset of the events in the data store and an extraction rule can specify how to extract a value from each of the subset of events for which the field has been defined. The extraction rule for a field is often defined using a regular expression ("regex" rule), and it associates event data with a logical type of information that is contained within an event for which it is defined. The term "late-binding schema" refers to a system, such as in SPLUNK® ENTERPRISE, which does not define the schema at index time as with database technology; rather, in a system involving late-binding schema, the schema can be developed on an ongoing basis up until the time it needs to be applied (which is query time, as a query often specifies the criteria for events of interest in terms of events having specified value(s) for specified field(s)). As a data analyst learns more about the data in stored events, using a late-binding schema, he can continue to develop the schema up until the next time it is needed for a query.

Because SPLUNK® ENTERPRISE maintains the underlying searchable raw data and enables application of a late-binding schema, it has great power to enable dynamic investigation of issues that arise as a data analyst learns more about the data stored in the system's events.

As discussed herein, "time-series data" and "time-series machine data" may include, among other things, a series or sequence of data points generated by one or more data sources, computing devices, or sensors. Each data point may be a value, a small segment of data, or a large segment of data, and each data point may be associated with a timestamp or be associated with a particular point in time that provides the basis for a timestamp for the data point. The series of data points, or values/statistics derived from the data points, may be plotted over a time range or time axis representing at least a portion of the time range. The data can be structured, unstructured, or semi-structured and can come from files, directories, network packets, network events, and/or sensors. Unstructured data may refer, for example, to data whose structure is not fully understood or appreciated at the time the data is obtained by a data storage system, or it may refer to data that was generated without a particular schema in mind to facilitate the extraction of values for fields in the data during a search on the data. Machine data generated by, for example, data sources within an enterprise network environment is generally considered to be unstructured data. The visualization of such time-series data may be used to display statistical trends over time. The time-series machine data collected from a data source may be segmented or otherwise transformed into discrete events, where each event can be associated with a timestamp.

An "event" may include a single record of activity from a particular data source associated with a single timestamp. Such an event may correspond to, for example, one or more lines in a log file or other data input. Further, "events" may be derived from processing or indexing machine data, as described herein, or may include other kinds of events or notable events described herein. Events can also correspond to any time-series data, such as performance measurements of an IT component (e.g., a computer cluster, node, host, virtual machine, etc.), a sensor measurement, etc.

In an example, a field extractor within an enterprise network environment may be configured to automatically identify (e.g., using regular expression-based rules, delimiter-based rules, etc.) certain fields in the events while the events are being created, indexed, and/or stored. Alternatively, one or more fields can be identified within the events and added to the field extraction rules (used by the field extractor to identify fields within the events) by a user using a variety of techniques. Additionally, fields that correspond to metadata about the events, such as a timestamp, host, source, and source type for an event, may also be created; such fields may, in some cases, be referred to as "default fields" if they are determined automatically for all events at the time such events are created, indexed, and/or stored.

In some implementations, a given tag or alias may be assigned to a set of two or more fields to identify multiple fields that correspond to equivalent pieces of information, even though those fields may have different names or be defined for different sets of events. A set of tags or aliases used to identify equivalent fields in this way may be referred to as a common information model.

Data generated by various data sources may be collected and segmented into discrete events, each event corresponding to data from a particular point in time. Examples of such data sources include, but are not limited to, web servers, application servers, databases, firewalls, routers, operating systems, software applications executable at one or more computing devices within the enterprise data system, mobile devices, sensors, etc. The types of data generated by such data sources may be in various forms including, for example and without limitation, server log files, activity log files, configuration files, messages, network packet data, performance measurements or metrics, sensor measurements, etc.

Figure 10:
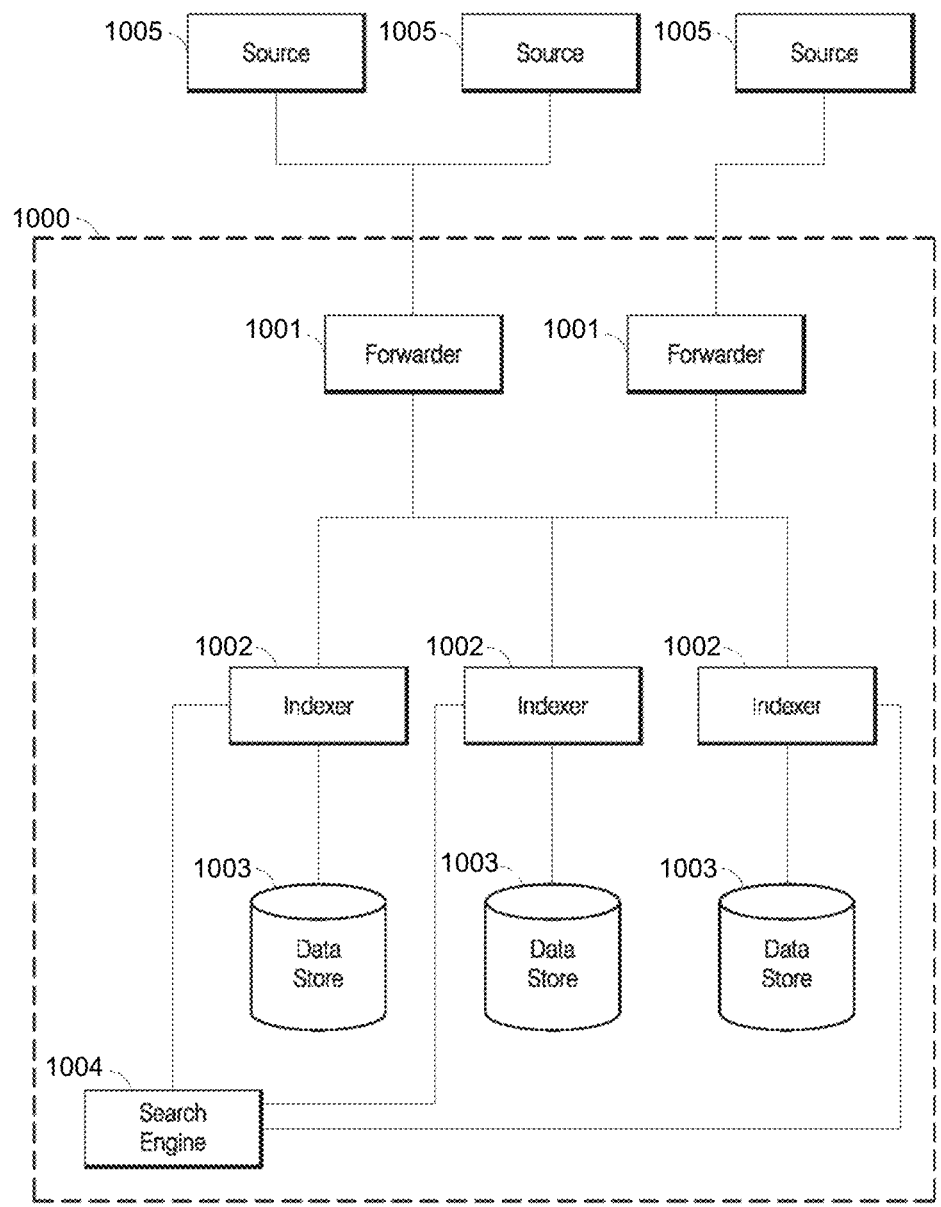
FIG. 10 illustrates an example a block diagram of a data intake and query system in accordance with the disclosed embodiments.

FIG. 10 shows a block diagram of SPLUNK® ENTERPRISE's data intake and query system, which provides an example embodiment of a data intake and query system 1000. Generally, the system 1000 includes one or more forwarders 1001 that collect data from a variety of different data sources 1005. The forwarders determine which indexer or indexers are to receive the data and forward the data to one or more indexers 1002. The data typically includes streams of time-series data. Time-series data refers to any data that can be segmented such that each segment can be associated with a time stamp. The data can be structured, unstructured, or semi-structured and can come from files and directories. Unstructured data is data that is not organized to facilitate the extraction of values for fields from the data, as is often the case with machine data and web logs, two popular data sources for SPLUNK® ENTERPRISE. Alternatively, heavy forwarders can strip out extraneous data and detect time stamps for the data. Based on the time stamps, the heavy forwarders can index and group the data into buckets that fall within a common time span. The heavy forwarders then determine which indexer or indexers are to receive each bucket of data and forward the data to one or more indexers 1002.

Figure 11:
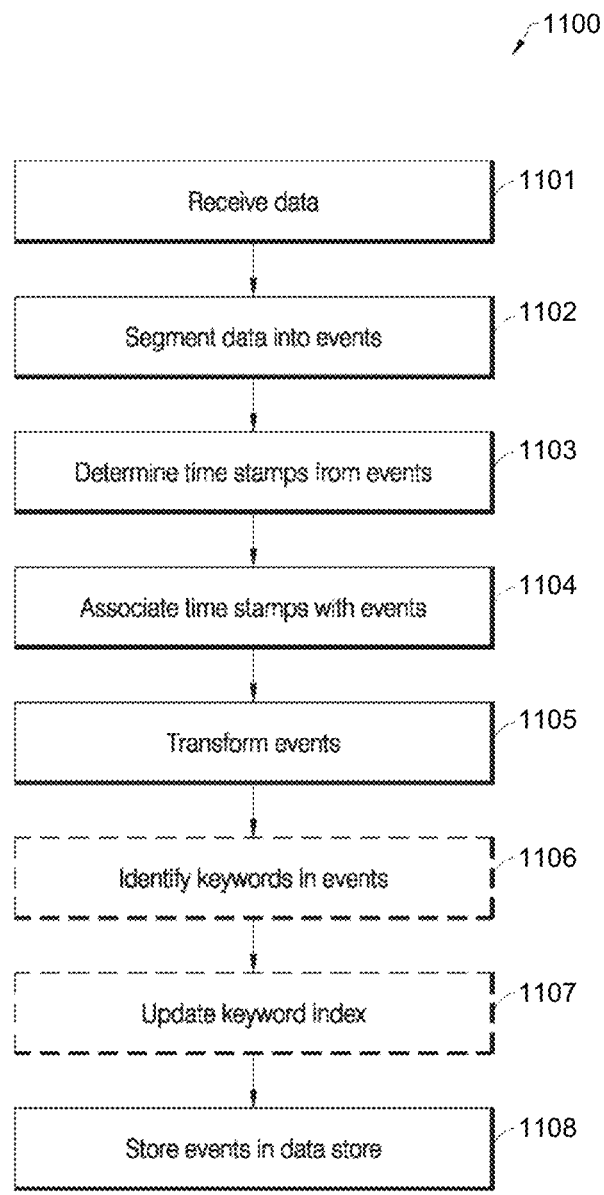
FIG. 11 illustrates a flowchart of a process that indexers may use to process, index, and store data received from forwarders in accordance with the disclosed embodiments.

FIG. 11 is a flowchart 1100 of a process that indexers 1002 may use to process, index, and store data received from the forwarders 1001. At block 1101, an indexer 1002 receives data from a forwarder 1001. At block 1102, the indexer segments the data into events. The data typically consists of many lines of text that are separated by a carriage return or line break. An event may consist of one or more of these lines. The task of the indexer is to determine where an event begins and ends in the lines of data. The indexer can use heuristics that allow it to automatically determine how many lines constitute an event. The indexer may be informed of the source of the data and have a set of heuristic rules for the source. The indexer may also be able to examine a sampling of the data and automatically determine the source of the data and have a set of heuristic rules for that source. These heuristics allow the indexer to use regular expression-based rules, delimiter-based rules, etc., to examine the text in each line in order to combine lines of data to form an event. The indexer can examine the text for event boundaries within the text that include, but are not limited to: predefined characters, character strings, etc. These may include certain punctuation marks or special characters including, for example, carriage returns, tabs, spaces, line breaks, etc. In some instances, a user can fine tune or configure the rules that the indexers use to examine the text in order to adapt to the user's equipment.

The indexer determines a time stamp for each event at block 1103. The time stamp can be determined by extracting the time from data in the event or by interpolating the time based on time stamps from other events. In some cases, a time stamp can be determined from the time the data was received or generated. The indexer associates the time stamp with each event at block 1104. For example, the time stamp may be stored as metadata for the event.

At block 1105, the data included in a given event can be transformed. Such a transformation can include such actions as removing part of an event (e.g., a portion used to define event boundaries, extraneous text, characters, etc.) or removing redundant portions of an event. A user can specify a portion to remove using a regular expression or any similar method.

Optionally, a key word index can be built to facilitate fast keyword searching of events. To build such an index, in block 1106, the indexer identifies a set of keywords contained in the events. At block 1107, the indexer includes each identified keyword in an index, which associates with each stored keyword pointers to each event containing that keyword (or locations within events where that keyword is found). When an indexer receives a keyword-based query, the indexer can then consult this index to quickly find those events containing the keyword without having to examine again each individual event, thereby greatly accelerating keyword searches.

The indexer stores events in a data store at block 1108. The data can be stored in working, short-term and/or long-term memory in a manner retrievable by query. The time stamp can be stored along with each event to help optimize searching the events by time range.

In some instances, the stored data includes a plurality of individual storage buckets, each corresponding to a time range. An event can then be stored in a bucket associated with a time range inclusive of the event's time stamp. This not only optimizes time based searches, but it can allow events with recent time stamps that may have a higher likelihood of being accessed to be stored at preferable memory locations that lend to quicker subsequent retrieval (such as flash memory instead of hard disk media).

Data stores 1003 may be distributed across multiple indexers, each responsible for storing and searching a subset, or buckets, of the events generated by the system. By distributing the time-based buckets among the indexers, the indexers can find events responsive to a query in parallel using map-reduce techniques, each returning their partial responses for specific buckets to the query to a search head that combines the results together to answer the query.

Figure 12:
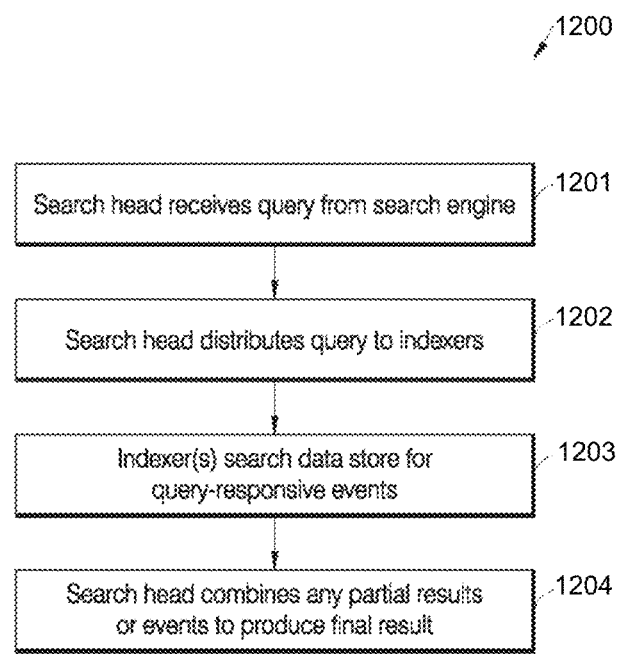
FIG. 12 illustrates a flowchart of a process that a search head and indexers perform during a typical search query in accordance with the disclosed embodiments.

FIG. 12 is a flowchart 1200 of a process that a search head 1004 and indexers 1002 may perform during a typical search query. At block 1201, a search head receives a query from a client.

At block 1202, the search head is responsible for analyzing the search query to determine what part can be delegated for execution by indexers and what part needs to be executed by the search head. Streaming commands can be trivially delegated to the indexers. Conversely, aggregating commands are more complex to distribute.

The search head can perform optimization steps in order to make the search more efficient. As mentioned above, the indexers may create an index of keywords. In one optimization, before the search starts executing, the search head determines the time range required for the search and a set of common keywords that all matching events must have. The retrieval phase uses these parameters to query the indexers for a superset of the eventual results. The indexers return the superset of results that the search head can perform a filtering stage on. The filtering stage performs field extraction on the superset to arrive at a reduced set of search results.

In another optimization, to achieve better computation distribution and minimize the amount of data transferred between indexers and the search head, many aggregating commands implement a map operation which the search head can delegate to the indexers while executing the reduce operation locally. FIG. 13 shows an example of a search query 1301 received from a client that the search head can split into two parts: one part to be executed by indexers 1302 and one part to be executed by the search head 1303. Here, the search query 1302 makes the indexers responsible for counting the results by host and then sending their results to the search head. The search head then performs the merging 1303. This achieves both computation distribution and minimal data transfer.

The search head distributes the indexer search query to one or more distributed indexers. The search query may contain one or more regular expressions that the indexer is to apply to any event data that is found to fall within the parameters of the regular expression. These indexers can include those with access to data stores having events responsive to the query. For example, the indexers can include those with access to events with time stamps within part or all of a time period identified in the query.

At block 1203, one or more indexers to which the query was distributed searches its data store for events responsive to the query. To determine events responsive to the query, a searching indexer finds events specified by the criteria in the query. This criteria can include that the events have particular keywords or contain a specified value or values for a specified field or fields (because this employs a late-binding schema, extraction of values from events to determine those that meet the specified criteria occurs at the time this query is processed). It should be appreciated that, to achieve high availability and to provide for disaster recovery, events may be replicated in multiple data stores, in which case indexers with access to the redundant events and not assigned as the primary indexer for the events, would not respond to the query by processing the redundant events. In an example, the indexer finds events that it is the primary indexer for that fall within a block of time specified by the one or more regular expressions. The indexer then processes the contents of the events using the one or more regular expressions, extracting information associated with fields specified in the one or more regular expressions. The indexers can either stream the relevant events back to the search head or use the events to calculate a partial result responsive to the query and send the partial result back to the search head. At block 1204, the search head combines or reduces all of the partial results or events received from the parallel processing indexers together to determine a final result responsive to the query.

Data intake and query system 1000 and the processes described with respect to FIGS. 10-13 are further discussed and elaborated upon in Carasso, David. Exploring Splunk Search Processing Language (SPL) Primer and Cookbook. New York: UM Research, 2012 and in Ledion Bitincka, Archana Ganapathi, Stephen Sorkin, and Steve Zhang. Optimizing data analysis with a semi-structured time series database. In SLAML, 2010. Each of these references is hereby incorporated by reference in its entirety for all purposes.

SPLUNK® ENTERPRISE can accelerate some queries used to periodically generate reports that, upon each subsequent execution, are intended to include updated data. To accelerate such reports, a summarization engine periodically generates a summary of data responsive to the query defining the report for a defined, non-overlapping subset of the time period covered by the report. For example, where the query is meant to identify events meeting specified criteria, a summary for a given time period may include only those events meeting the criteria. Likewise, if the query is for a statistic calculated from events, such as the number of events meeting certain criteria, then a summary for a given time period may be the number of events in that period meeting the criteria.

Because the report, whenever it is run, includes older time periods, a summary for an older time period can save the work of having to re-run the query on a time period for which a summary was generated, so only the newer data needs to be accounted for. Summaries of historical time periods may also be accumulated to save the work of re-running the query on each historical time period whenever the report is updated.

A process for generating such a summary or report can begin by periodically repeating a query used to define a report. The repeated query performance may focus on recent events. The summarization engine determines automatically from the query whether generation of updated reports can be accelerated by creating intermediate summaries for past time periods. If it can, then a summarization engine can periodically create a non-overlapping intermediate summary covering new data obtained during a recent, non-overlapping time period and stores the summary in a summary data store.

In parallel to the creation of the summaries, the query engine schedules the periodic updating of the report defined by the query. At each scheduled report update, the query engine determines whether intermediate summaries have been generated covering parts of the time period covered by the current report update. If such summaries exist, then the report is based on the information from the summaries; optionally, if additional data has been received that has not yet been summarized but that is required to generate a complete report, then the query is run on this data and, together with the data from the intermediate summaries, the updated current report is generated. This process repeats each time an updated report is scheduled for creation.

Search and report acceleration methods are described in U.S. Pat. No. 8,589,403, issued on Nov. 19, 2013, and U.S. Pat. No. 8,412,696, issued on Apr. 2, 2011, both of which are hereby incorporated by reference in their entirety for all purposes.

CONCLUSION

The disclosed embodiments relate to a system that displays performance data for a computing environment. During operation, the system first determines values for a performance metric for a plurality of entities that comprise the computing environment. Next, the system displays the computing environment as a tree comprising nodes representing the plurality of entities and edges representing parent-child relationships between the plurality of entities. While displaying the tree, the system displays the child nodes for each parent in sorted order based on values of the performance metric associated with the child nodes.

In some embodiments, the system determines the values for the selected performance metric by receiving, from a user, a selection of the performance metric from a set of monitored performance metrics; and then obtaining the values for the selected performance metric for the plurality of entities from the performance data for the computing environment.

In some embodiments, while determining the sorted order for the child nodes, the system first determines a performance state for each child node based on a value of the performance metric for an entity associated with the child node, wherein the performance states can include a critical state, a warning state, a normal state, and an unknown state. Moreover, if a child node has descendants in the tree, the performance state associated with the child node includes performance states for the descendants of the child node. Next, the system sorts the child nodes based on the determined performance states, wherein the sorted order is determined based on the number of critical states associated with each child node.

In some embodiments, the system determines the performance states for the plurality of entities by comparing the values of the performance metric for the plurality of entities against one or more state-specific threshold values to determine the associated performance states for the plurality of entities.

In some embodiments, an entity can include: a host system; a virtual machine; a cluster comprising one or more host systems; and a virtual center comprising one or more clusters.

In some embodiments, the performance metric relates to one or more of: central-processing unit (CPU) utilization; memory utilization; disk utilization; and network utilization.

The disclosed embodiments also relate to a system that displays performance data for a computing environment. During operation, the system determines performance states for a plurality of entities that comprise the computing environment based on values of a performance metric for the entities. Next, the system displays the computing environment as a tree comprising nodes representing the plurality of entities and edges representing parent-child relationships between the plurality of entities. Then, for each parent node in the tree, the system determines counts of one or more performance states for descendants of the parent node in the tree. Finally, the system displays a graphical representation of the determined counts while displaying the parent node.

In some embodiments, displaying the graphical representation of the determined counts includes displaying a circular ring comprising visually distinct sections associated with different performance states, wherein the visually distinct sections are sized proportionately with the determined counts for the associated performance states.

In some embodiments, while displaying each leaf node in the tree, the system displays an indicator for a performance state associated with the leaf node.

In some embodiments, for a selected node in the tree, the system displays a chart with a line illustrating how a value of the performance metric for the selected node varies over time, wherein the line is displayed against a background illustrating how a distribution of the performance metric for a reference set of nodes in the tree varies over time.

In some embodiments, if the selected node is a parent node, the value of the performance metric for the selected node is an average value for the performance metric across descendant nodes of the selected node in the tree.

In some embodiments, the background includes a stream chart comprising regions associated with percentile ranges, wherein borders between the regions represent one or more of the following: a minimum value line, a $25^{th}$ percentile line, a $50^{th}$ percentile line, a $75^{th}$ percentile line, a $95^{th}$ percentile line, a maximum value line, and a line associated with a standard deviation.

In some embodiments, in response to the user selecting a first node in the tree to be pinned, the system displays a first detail panel for the first node, wherein the first detail panel displays state information for the first node, wherein the state information is frozen at the time of pinning. Moreover, in response to the user selecting a second node in the tree to be pinned, the system displays a second detail panel for the second node, wherein the second detail panel displays state information for the second node, wherein the state information is frozen at the time of pinning. Note that the first detail panel is displayed concurrently with the second detail panel to facilitate comparing state information between the first and second nodes.

In some embodiments, the state information for the first node displayed in the first detail panel includes: configuration information for the first node; and a graph displaying values of the first performance metric for the first node over a time interval.

In some embodiments, if the first node is a parent node in the tree, the state information for the first node displayed in the first detail panel includes: aggregated configuration information for one or more descendants of the first node; and one or more graphs displaying values of the first performance metric for the one or more descendants of the first node.

In some embodiments, if the first node and the second node are the same node, and if the user selects a second performance metric prior to selecting the second node to be pinned, while displaying the first detail panel the system displays state information for the first performance metric, and while displaying the second detail panel the system displays state information for the second performance metric. Note that the concurrent display of the first and second detail panels enables the user to view state for the first and second performance metrics for the same node at the same time.

The detailed description that appears above is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored on a non-transitory computer-readable storage medium as described above. When a system reads and executes the code and/or data stored on the non-transitory computer-readable storage medium, the system performs the methods and processes embodied as data structures and code and stored within the non-transitory computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Moreover, the foregoing descriptions of disclosed embodiments have been presented only for purposes of illustration and description. They are not intended to be exhaustive or to limit the disclosed embodiments to the forms disclosed. Accordingly, many modifications and variations will be apparent to practitioners skilled in the art.

Additionally, the above disclosure is not intended to limit the disclosed embodiments. The scope of the disclosed embodiments is defined by the appended claims.

What is claimed is:

1. A computer-implemented method for displaying performance data for a computing environment, the method comprising:
   displaying the computing environment as a tree including nodes representing a plurality of entities that comprise the computing environment and edges representing parent-child relationships between the plurality of entities, wherein the displayed tree indicates values of a first performance metric for each node in the tree; and
   in response to the user selecting a first node in the tree to be pinned, displaying a first detail panel for the first node concurrently with displaying the tree, wherein the first detail panel displays state information for the first node that remains unchanged after pinning;
   wherein when the first node is a parent node, the state information for the first node displayed in the first detail panel includes one or more graphs displaying values of the first performance metric for descendants of the first node;
   wherein when the first node is a leaf node, the state information for the first node displayed in the first detail panel includes a graph displaying values of the first performance metric for the first node;
   in response to the user selecting a second node in the tree to be pinned, displaying a second detail panel for the second node concurrently with displaying the tree, wherein the second detail panel displays state information for the second node that remains unchanged after pinning; and
   wherein the first detail panel is displayed concurrently with the second detail panel to facilitate comparing state information between the first and second nodes.

2. The computer-implemented method of claim 1,
   wherein when the first node is a parent node, the state information for the first node displayed in the first detail panel includes an aggregated configuration information of one or more descendants of the first node; and
   wherein when the first node is a leaf node, the state information for the first node displayed in the first detail panel includes a configuration information for the first node.

3. The computer-implemented method of claim 1, wherein when the first node and the second node are the same node, and when the user selects a second performance metric prior to selecting the second node to be pinned:
   displaying the first detail panel involves displaying state information for the first performance metric;
   displaying the second detail panel involves displaying state information for the second performance metric; and
   wherein the concurrent display of the first and second detail panels enables the user to view state for the first and second performance metrics for the same node at the same time.

4. The computer-implemented method of claim 1, wherein prior to displaying the tree, the method further comprises:
   receiving, from a user, a selection of the first performance metric from a set of monitored performance metrics; and
   obtaining the values for the first performance metric for the plurality of entities from the performance data for the computing environment.

5. The computer-implemented method of claim 1, wherein an entity can include:
   a virtual machine;
   a host system that executes one or more virtual machines;
   a cluster comprising one or more host systems; and
   a virtual center comprising one or more clusters.

6. The computer-implemented method of claim 1, wherein the first performance metric relates to one or more of:
   central-processing unit (CPU) utilization;
   memory utilization;
   disk utilization;
   network utilization; and
   power consumption.

7. The computer-implemented method of claim 1, wherein the performance metric is measured over a user-specified time interval.

8. A non-transitory computer-readable storage medium storing instructions that when executed by a computer cause the computer to perform a method for displaying performance data for a computing environment, the method comprising:
   displaying the computing environment as a tree including nodes representing a plurality of entities that comprise the computing environment and edges representing parent-child relationships between the plurality of entities, wherein the displayed tree indicates values of a first performance metric for each node in the tree; and
   in response to the user selecting a first node in the tree to be pinned, displaying a first detail panel for the first node concurrently with displaying the tree, wherein the first detail panel displays state information for the first node that remains unchanged after pinning;

wherein when the first node is a parent node, the state information for the first node displayed in the first detail panel includes one or more graphs displaying values of the first performance metric for descendants of the first node;

wherein when the first node is a leaf node, the state information for the first node displayed in the first detail panel includes a graph displaying values of the first performance metric for the first node;

in response to the user selecting a second node in the tree to be pinned, displaying a second detail panel for the second node concurrently with displaying the tree, wherein the second detail panel displays state information for the second node that remains unchanged after pinning; and wherein the first detail panel is displayed concurrently with the second detail panel to facilitate comparing state information between the first and second nodes.

9. The non-transitory computer-readable storage medium of claim 8, wherein when the first node is a parent node, the state information for the first node displayed in the first detail panel includes an aggregated configuration information of one or more descendants of the first node; and wherein when the first node is a leaf node, the state information of the first node displayed in the first detail panel includes a configuration information for the first node.

10. The non-transitory computer-readable storage medium of claim 8, wherein when the first node and the second node are the same node, and when the user selects a second performance metric prior to selecting the second node to be pinned, displaying the first detail panel involves displaying state information for the first performance metric;

displaying the second detail panel involves displaying state information for the second performance metric; and wherein the concurrent display of the first and second detail panels enables the user to view state for the first and second performance metrics for the same node at the same time.

11. The non-transitory computer-readable storage medium of claim 8, wherein prior to displaying the tree, the method further comprises:

receiving, from a user, a selection of the first performance metric from a set of monitored performance metrics; and obtaining the values for the first performance metric for the plurality of entities from the performance data for the computing environment.

12. The non-transitory computer-readable storage medium of claim 8, wherein an entity can include:

a virtual machine;
a host system that executes one or more virtual machines;
a cluster comprising one or more host systems; and
a virtual center comprising one or more clusters.

13. The non-transitory computer-readable storage medium of claim 8, wherein the first performance metric relates to one or more of:

central-processing unit (CPU) utilization;
memory utilization;
disk utilization;
network utilization; and
power consumption.

14. The non-transitory computer-readable storage medium of claim 8, wherein the performance metric is measured over a user-specified time interval.

15. A system that displays performance data for a computing environment, the method comprising:

a computing cluster comprising a plurality of processors and associated memories; and a performance-monitoring mechanism that executes on the computing cluster, wherein during operation the performance-monitoring mechanism:

displays the computing environment as a tree including nodes representing a plurality of entities that comprise the computing environment and edges representing parent-child relationships between the plurality of entities, wherein the displayed tree indicates values of a first performance metric for each node in the tree; and in response to the user selecting a first node in the tree to be pinned, displays a first detail panel for the first node concurrently with displaying the tree, wherein the first detail panel displays state information for the first node that remains unchanged after pinning;

wherein when the first node is a parent node, the state information for the first node displayed in the first detail panel includes one or more graphs displaying values of the first performance metric for descendants of the first node;

wherein when the first node is a leaf node, the state information for the first node displayed in the first detail panel includes a graph displaying values of the first performance metric for the first node;

in response to the user selecting a second node in the tree to be pinned, displays a second detail panel for the second node concurrently with displaying the tree, wherein the second detail panel displays state information for the second node that remains unchanged after pinning; and wherein the first detail panel is displayed concurrently with the second detail panel to facilitate comparing state information between the first and second nodes.

16. The system of claim 15, wherein when the first node is a parent node, the state information for the first node displayed in the first detail panel includes an aggregated configuration information of one or more descendants of the first node; and wherein when the first node is a leaf node, the state information of the first node displayed in the first detail panel includes a configuration information for the first node.

17. The system of claim 15, wherein when the first node and the second node are the same node, and when the user selects a second performance metric prior selecting the second node to be pinned:

while displaying the first detail panel, the performance-monitoring mechanism displays state information for the first performance metric;

while displaying the second detail panel, the performance-monitoring mechanism displays state information for the second performance metric; and wherein the concurrent display of the first and second detail panels enables the user to view state for the first and second performance metrics for the same node at the same time.

18. The system of claim 15, wherein prior to displaying the tree, the performance-monitoring mechanism:

receives, from a user, a selection of the first performance metric from a set of monitored performance metrics; and obtains the values for the first performance metric for the plurality of entities from the performance data for the computing environment.

19. The system of claim 15, wherein an entity can include:
a virtual machine;
a host system that executes one or more virtual machines;
a cluster comprising one or more host systems; and
a virtual center comprising one or more clusters.

20. The system of claim 15, wherein the first performance metric relates to one or more of:
central-processing unit (CPU) utilization;
memory utilization;
disk utilization;
network utilization; and
power consumption.

* * * * *